(12) United States Patent
Yang et al.

(10) Patent No.: US 12,176,347 B2
(45) Date of Patent: Dec. 24, 2024

(54) INPUT/OUTPUT DEVICES

(71) Applicant: Taiwan Semiconductor Manufacturing Co., Ltd., Hsinchu (TW)

(72) Inventors: Sung-Hsin Yang, Hsinchu (TW); Jung-Chi Jeng, Tainan (TW); Ru-Shang Hsiao, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/349,486

(22) Filed: Jul. 10, 2023

(65) Prior Publication Data

US 2023/0352483 A1   Nov. 2, 2023

Related U.S. Application Data

(62) Division of application No. 17/025,802, filed on Sep. 18, 2020, now Pat. No. 11,699,702.

(Continued)

(51) Int. Cl.
*H01L 27/088* (2006.01)
*H01L 21/8234* (2006.01)
*H01L 29/417* (2006.01)
*H01L 29/66* (2006.01)
*H01L 29/78* (2006.01)

(52) U.S. Cl.
CPC .. *H01L 27/0886* (2013.01); *H01L 21/823431* (2013.01); *H01L 21/823468* (2013.01); *H01L 29/41791* (2013.01); *H01L 29/6681* (2013.01); *H01L 29/785* (2013.01)

(58) Field of Classification Search
CPC ......... H01L 27/0886; H01L 21/823431; H01L 21/823468; H01L 29/41791; H01L 29/6681; H01L 29/785
See application file for complete search history.

(56) References Cited

U.S. PATENT DOCUMENTS 9,431,513 B2   8/2016   Liu
9,716,146 B2   7/2017   Peng
(Continued)

FOREIGN PATENT DOCUMENTS

CN   108231876 A   6/2018
CN   110610861 A   12/2019

*Primary Examiner* — Christine A Enad
(74) *Attorney, Agent, or Firm* — HAYNES AND BOONE, LLP

(57) ABSTRACT

Semiconductor devices and methods are provided. A semiconductor device according to the present disclosure includes a first transistor in a first area and a second transistor in a second area. The first transistor includes a first gate structure extending lengthwise along a first direction, and a first gate spacer, a second gate spacer, and a third gate spacer over sidewalls of the first gate structure. The second transistor includes a second gate structure extending lengthwise along the first direction, and the first gate spacer and the third gate spacer over sidewalls of the second gate structure. The first gate spacer, the second gate spacer and the third gate spacer are of different compositions and the third gate spacer is directly on the first gate spacer in the second area.

20 Claims, 33 Drawing Sheets

Related U.S. Application Data

(60) Provisional application No. 63/015,842, filed on Apr. 27, 2020.

(56) References Cited

U.S. PATENT DOCUMENTS

| | | | |
|---|---|---|---|
| 9,947,764 | B2 | 4/2018 | Liu |
| 10,037,915 | B1 | 7/2018 | Hsu |
| 10,164,016 | B2 | 12/2018 | Peng |
| 10,418,460 | B2 | 9/2019 | Liu |
| 2006/0051922 | A1 | 3/2006 | Huang |
| 2013/0292774 | A1* | 11/2013 | Hoentschel ....... H01L 29/41783 257/E21.409 |
| 2014/0183642 | A1* | 7/2014 | Liang ............. H01L 21/823412 438/299 |
| 2015/0228546 | A1 | 8/2015 | Huang |
| 2017/0117296 | A1 | 4/2017 | Chhun |
| 2017/0317213 | A1* | 11/2017 | Park ..................... H01L 29/785 |
| 2017/0323886 | A1 | 11/2017 | Chuang |
| 2018/0040707 | A1 | 2/2018 | Park |
| 2019/0157421 | A1* | 5/2019 | Wang .............. H01L 21/823456 |
| 2020/0227407 | A1 | 7/2020 | Radosavljevic |
| 2021/0098592 | A1 | 4/2021 | Kang |

\* cited by examiner

INPUT/OUTPUT DEVICES

PRIORITY DATA

This is a divisional application of U.S. patent application Ser. No. 17/025,802, filed Sep. 18, 2020, which claims priority to U.S. Provisional Patent Application No. 63/015,842, filed on Apr. 27, 2020, each of which is hereby incorporated herein by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device fabrication are needed.

The scaling down of the semiconductor devices also reduces thicknesses of gate dielectric layers, which commands reduced gate voltage to avoid device failure. However, the supply voltage from the external circuitry has not kept up with the pace of scaling down of the semiconductor devices. While the thickness of a gate dielectric layer has been reduced multiple-folds, the supply voltage has only been reduced from about 5 volts to about 2.5 to 3.3 volts. This uneven scaling trend has resulted in ever increasing electric fields in the gate dielectric layer near the drain. The increased electric fields in turn leads to hot carrier injection (HCI, or hot carrier effect (HCE)), which describes a phenomenon where charge carriers (electrons or holes) gain high kinetic energy due to presence of high electric field. HCI is not desirable as it degrades device performance and results in leakages. HCI is especially relevant to input/output (I/O) devices as they interface external circuitry operating at the supply voltage. HCI concerns may prevent multi-gate devices, such as fin-type field effect transistors (FinFETs), from being used as I/O devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
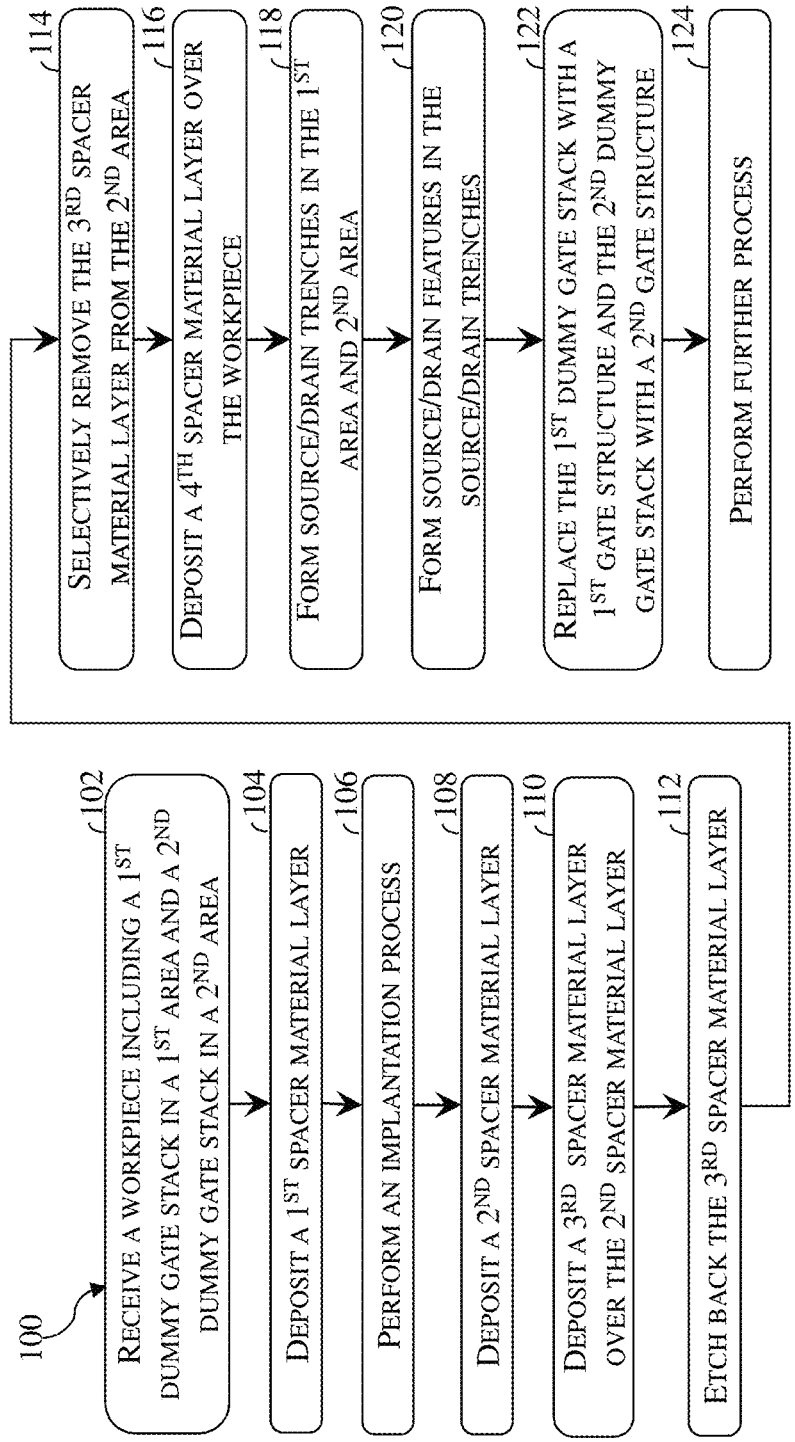
FIG. 1 is a flowchart of a method of fabricating a semiconductor device, according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed interposing the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The scaling down of the semiconductor devices reduces thicknesses of gate dielectric layers and increases electric fields in the gate dielectric layers near the drains. The increased electric fields may lead to hot carrier injection (HCI, or hot carrier effect (HCE)), which describes a phenomenon where charge carriers (electrons or holes) gain high kinetic energy due to presence to high electric field and inject into gate dielectric layers. HCI is not desirable as it can shift threshold voltages, degrade device performance, and result in leakages. Because input/output (I/O) devices operate at voltages (e.g., between about 2.5V and about 5.0V) higher than the operating voltage of core devices, I/O devices are more prone to experience HCI-related failure and performance issues. When forming an I/O FinFET, source/drain trenches or the resulting source/drain features may undercut the gate spacers, thereby reducing the channel length and distance between the channel and the drain. The reduction of distance between the channel and drain may exacerbate HCI.

The present disclosure provides embodiments where an I/O device and a core device fabricated on the same substrate have different gate spacer arrangements to satisfy the switching speed requirement for the core devices as well as reduction of HCI for the I/O devices. In these embodiments, the I/O device includes an additional booster spacer while the core device is free of such an additional booster spacer. The additional booster spacer increases the distance between the channel and the drain of the I/O device and reduces the occurrence of HCI. The booster spacer may be formed of silicon oxide and may be protected by gate spacers that are more etch-resistant.

The various aspects of the present disclosure will now be described in more detail with reference to the figures. FIGS. 1, 12 and 23 illustrate flowcharts of a method 100, a method 400, and a method 500 of forming a semiconductor device on a workpiece 200 (not shown in FIGS. 1, 12 and 23, but shown in FIGS. 2-11, 13-22 and 24-33). Methods 100, 400 and 500 are merely examples and not intended to limit the present disclosure beyond what is explicitly recited in the claims. Additional operations can be provided before, during, and after methods 100, 400 and 500, and some operations described can be replaced, eliminated, or moved around for additional embodiments of these methods. The method 100 is described below in conjunction with FIGS. 2-11, the method 400 is described below in conjunction with FIGS. 13-22, and the method 500 is described below in conjunction with FIGS. 24-33. Each of FIGS. 2-11, 13-22, and 24-33 illustrates a fragmentary cross-sectional view of the workpiece 200 during various operations of method 100, method 400 or method 500. The present disclosure is not limited to any particular number of devices or device regions, or to any particular device configurations. Additional features can be added in semiconductor devices fabricated on the workpiece 200, and some of the features described below can be replaced, modified, or eliminated in other embodiments of the semiconductor device to be fabricated on the workpiece 200. Because a semiconductor device is to be formed from the workpiece 200 at the conclusion of the processes described in the present disclosure, the workpiece 200 may be referred to as a semiconductor device 200 as the context requires. Operations of method 100 are described below, followed by descriptions of method 400 and method 500. Methods 400 and 500 share similar operations with method 100 and such similar operations in methods 400 and 500 may be simplified or omitted for brevity.

Figure 2:
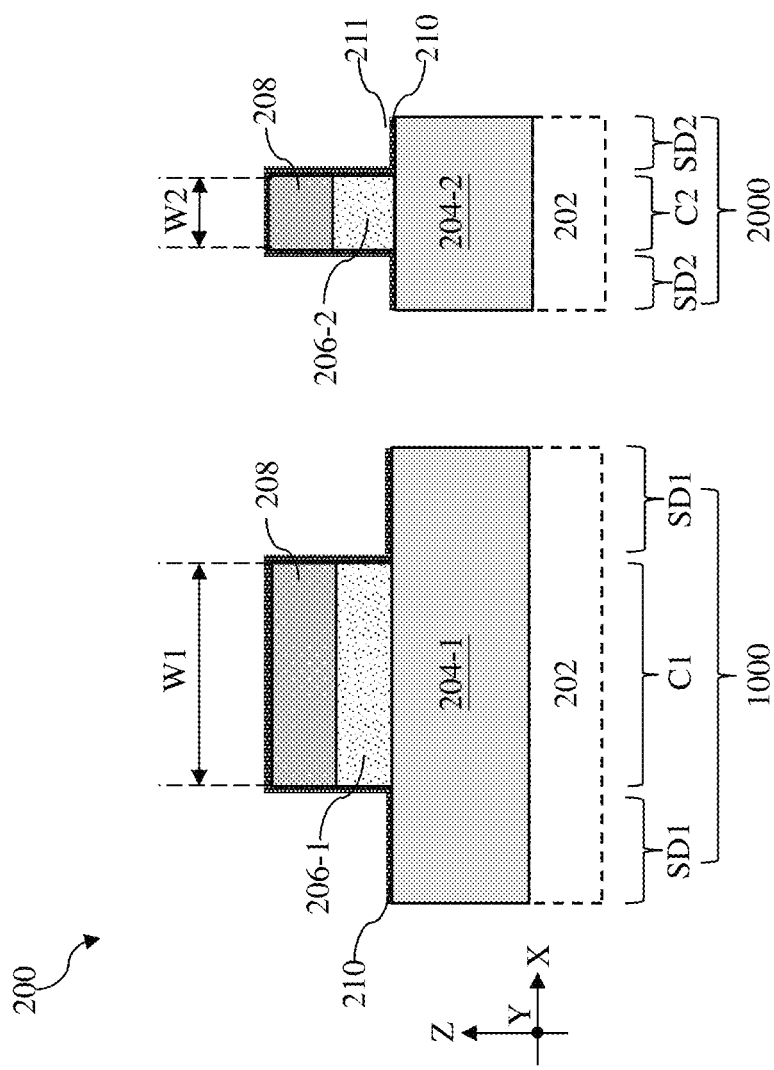
FIGS. 2-11 are fragmentary cross-sectional views of a workpiece undergoing various operations of the method in FIG. 1, according to various aspects of the present disclosure.
Figure 3:
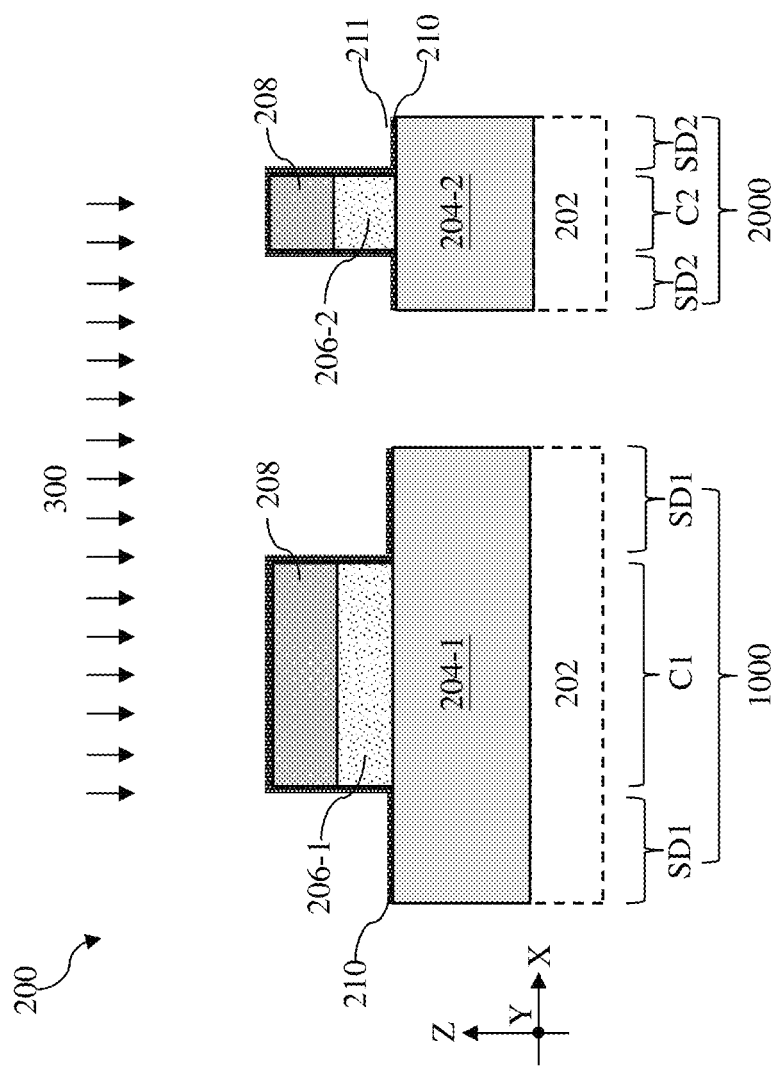

Referring to FIGS. 1 and 2, method 100 includes a block 102 where a workpiece 200 is received. As shown in FIG. 2, the workpiece 200 includes a substrate 202, a first fin structure 204-1 over a first area 1000 of the substrate 202, a second fin structure 204-2 over a second area 2000 of the substrate 202, a first dummy gate stack 206-1 over the first fin structure 204-1, and a second dummy gate stack 206-2 over the second fin structure 204-2. In some embodiments, the first area 1000 may be a high voltage device area or an I/O device area and the second area 2000 may be a logic device area that includes logic devices, memory devices, or digital signal processing devices. In some implementations, devices in the first area 1000 operate and are configured to operate at an operating voltage between about 2.5 V and 5V and devices in the second area 2000 operate and are configured to operate at an operating voltage between about 0.5 V and about 1 V. As shown in FIG. 2, the first fin structure 204-1 and the second fin structure 204-2 may be parallel to one another. Each of the first fin structure 204-1 and the second fin structure 204-2 is connected to and arising from the substrate 202. Additionally, each of the first fin structure 204-1 and the second fin structure 204-2 may be referred to as an active region or a fin-shaped active region.

The substrate 202 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a silicon oxide layer. In another example, the substrate 202 may include a conductive layer, a semiconductor layer, a dielectric layer, other layers, or combinations thereof. In some embodiments where the substrate 202 includes different types of transistors, various doped regions, such as source/drain regions, are disposed in or on the substrate 202. The doped regions may be doped with n-type dopants, such as phosphorus or arsenic, and/or p-type dopants, such as boron or $BF_2$, depending on design requirements. The doped regions may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques. For simplicity, the substrate 202 is only schematically shown in FIG. 2 and is omitted from FIGS. 3-9 for simplicity.

The first fin structure 204-1 and the second fin structure 204-2 may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the first fin structure 204-1 and the second fin structure 204-2 on the substrate 202. The etching process may include dry etching, wet etching, reactive ion etching (RIE), and/or other suitable processes. Numerous other embodiments of methods for forming the first fin structure 204-1 and the second fin structure 204-2 may be suitable. For example, the first fin structure 204-1 and the second fin structure 204-2 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the plurality of fin structures 204. The first fin structure 204-1 and the second fin structure 204-2 extend lengthwise along the X direction.

While not explicitly shown in FIG. 2, the first fin structure 204-1 and the second fin structure 204-2 may be separated from neighboring fin structures by an isolation feature that may include silicon oxide, silicon nitride, silicon oxynitride, fluoride-doped silicate glass (FSG), a low-k dielectric material, and/or other suitable materials. The isolation feature may include shallow trench isolation (STI) features. In one embodiment, the isolation feature may be formed by etching trenches in the substrate 202 during the formation of the first fin structure 204-1 and the second fin structure 204-2. The trenches may then be filled with an isolating material described above by a deposition process, followed by a chemical mechanical planarization (CMP) process. Other isolation structure such as field oxide, local oxidation of silicon (LOCOS), and/or other suitable structures may also be implemented as the isolation feature. The isolation feature may be deposited by any suitable method, such as chemical vapor deposition (CVD), flowable CVD (FCVD), spin-on-glass (SOG), other suitable methods, or combinations thereof.

As shown in FIG. 2, the first dummy gate stack 206-1 is disposed over a first channel region C1 of the first fin structure 204-1 in the first area 1000. The first channel region C1 is sandwiched between two first source/drain regions SD1 of the first fin structure 204-1. Similarly, the second dummy gate stack 206-2 is disposed over a second channel region C2 of the second fin structure 204-2 in the second area 2000. The second channel region C2 is sandwiched between two second source/drain regions SD2 of the second fin structure 204-2. In some embodiments, the first dummy gate stack 206-1 and the second dummy gate stack 206-2 may include polysilicon. For purposes of patterning, the workpiece 200 may further include a gate-top hard mask 208 over the first dummy gate stack 206-1 and the second dummy gate stack 206-2. The gate-top hard mask 208 may be a single layer or a multilayer. In some instances where the gate-top hard mask 208 is a multilayer, the gate-top hard mask 208 includes a pad oxide layer and a pad nitride layer over the pad oxide layer. The first dummy gate stack 206-1 and the second dummy gate stack 206-2 extend lengthwise along the Y direction, which is perpendicular to the X direction. Although not explicitly shown, a dummy gate dielectric layer may be deposited over the first fin structure 204-1 and the second fin structure 204-2 before the formation of the first dummy gate stack 206-1 and the second dummy gate stack 206-2. The dummy gate dielectric layer may be formed of silicon oxide. As illustrated in FIG. 2, a first width W1 of the first dummy gate stack 206-1 is greater than a second width W2 of the second dummy gate stack 206-2 to provide a longer channel length in the first area 1000.

Referring to FIGS. 1 and 2, method 100 includes a block 104 where a first spacer material layer 210 is deposited over the workpiece 200. In some embodiments, the first spacer material layer 210 may include silicon, oxygen, carbon and nitrogen. In one embodiment, the first spacer material layer 210 may include silicon oxycarbonitride (SiOCN). The first spacer material layer 210 may have a dielectric constant similar to that of a silicon oxide layer. In some implementations, the first spacer material layer 210 may be deposited over the first dummy gate stack 206-1 and the second dummy gate stack 206-2 using CVD process, a subatmospheric CVD (SACVD) process, an ALD process, a PVD process, or other suitable process. In some implementations, the first spacer material layer 210 may have a thickness between about 2.5 nm and about 3.0 nm.

Referring to FIGS. 1 an 3, method 100 includes a block 106 where an implantation process 300 is performed. In some embodiments, the implantation process 300 is performed to form lightly doped source/drain (LDD) zones (not shown) over the first source/drain region SD1 and the second source/drain regions SD2. The implantation process 300 may utilize n-type dopants, such as phosphorus (P) or arsenic (As), for n-type field effect transistors (NFETs), or p-type dopants, such as boron (B) or indium (In), for p-type field effect transistors (PFETs). For example, operations at block 106 may implant n-type dopant(s) into the first source/drain region SD1 and the second source/drain regions SD2. The LDD regions are self-aligned with first dummy gate stack 206-1 and the second dummy gate stack 206-2. In some implementations, the first spacer material layer 210 serves as a screen layer or protective layer to control the thickness of the LDD zones and to reduce surface damages. Although not explicitly shown in the figures, after the implantation process 300, the workpiece 200 is annealed to activate the implanted ions in the LDD zones.

Figure 4:
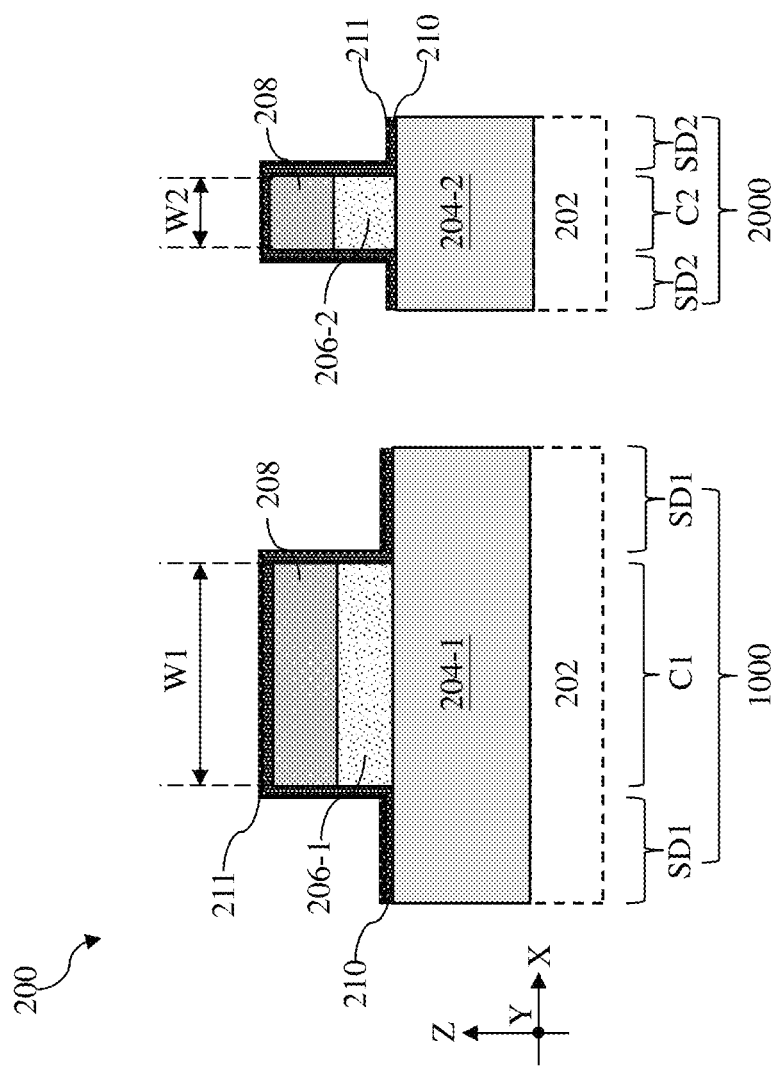

Referring to FIGS. 1 and 4, method 100 includes a block 108 where a second spacer material layer 211 is deposited over the first spacer material layer 210. In some embodiments, the second spacer material layer 211 and the first spacer material layer 210 may have the same composition. In these embodiments, the second spacer material layer 211 may include silicon, oxygen, carbon and nitrogen. In one embodiment, the second spacer material layer 211 may include silicon oxycarbonitride (SiOCN). The second spacer material layer 211 may have a dielectric constant similar to that of a silicon oxide layer. In some implementations, the second spacer material layer 211 may be deposited over the first spacer material layer 210 using CVD process, an SACVD process, an ALD process, a PVD process, or other suitable process. In some implementations, the second spacer material layer 211 may have a thickness similar to that of the first spacer material layer 210. In some instances, the thickness of the second spacer material layer 211 may be between about 2.5 nm and about 3.0 nm.

Figure 5:
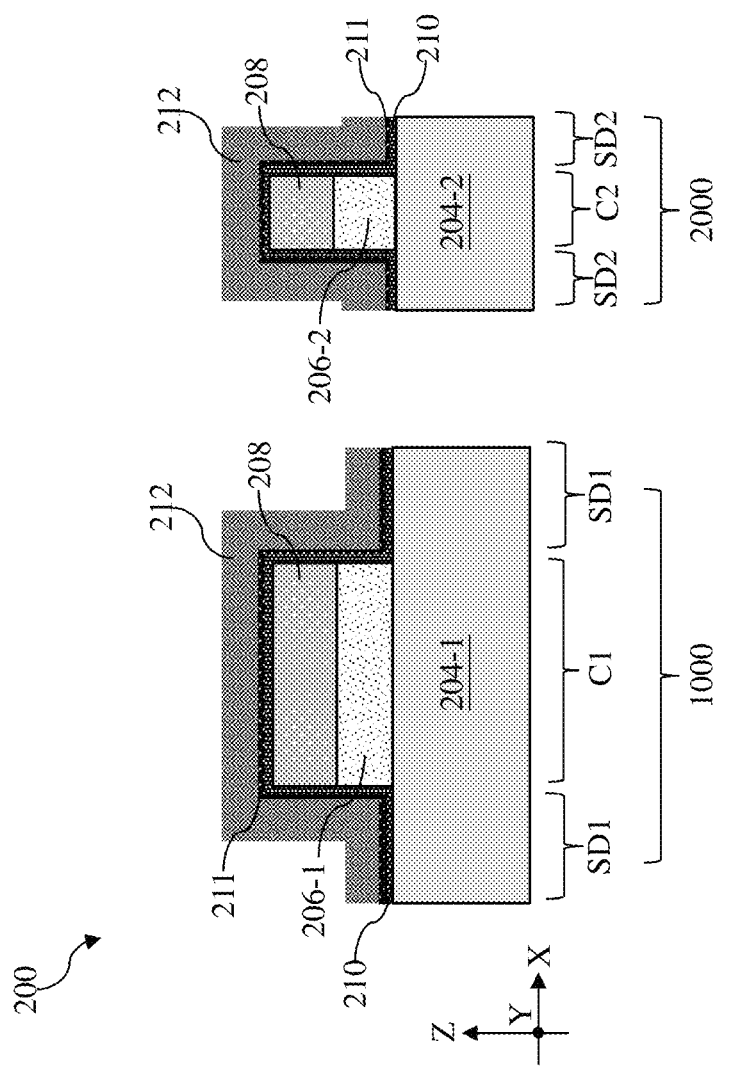

Referring to FIGS. 1 and 5, method 100 includes a block 110 where a third spacer material layer 212 is deposited over the second spacer material layer 211. The third spacer material layer 212 is formed of a dielectric material that is different from the fin structures, the first spacer material layer 210, the second spacer material layer 211, and the fourth spacer material layer 214 (to be described below). As such, its different composition allows selective removal of the third spacer material layer 212 without damaging adjacent structures. In some embodiments, the third spacer material layer 212 may include silicon, carbon, or oxygen. In one embodiment, the third spacer material layer 212 may include silicon oxide. In some implementations, the third spacer material layer 212 may be porous and has a dielectric constant smaller than that of silicon oxide. In some implementations, the third spacer material layer 212 may be deposited over the second spacer material layer 211 using CVD process, an SACVD process, an ALD process, a PVD process, or other suitable process. According to the present disclosure, a thickness of the third spacer material layer 212 is greater than the thickness of the second spacer material layer 211 such that the third spacer material layer 212 may serve as a thickness booster. In this regard, the third spacer material layer 212 may also be referred to as a thickness booster layer. In some instances, the thickness of the third spacer material layer 212 may be between about 8 nm and about 20 nm. By design of the present disclosure, the third spacer material layer 212 has a low dielectric constant in order to increase thickness without increasing the dielectric constant.

Figure 6:
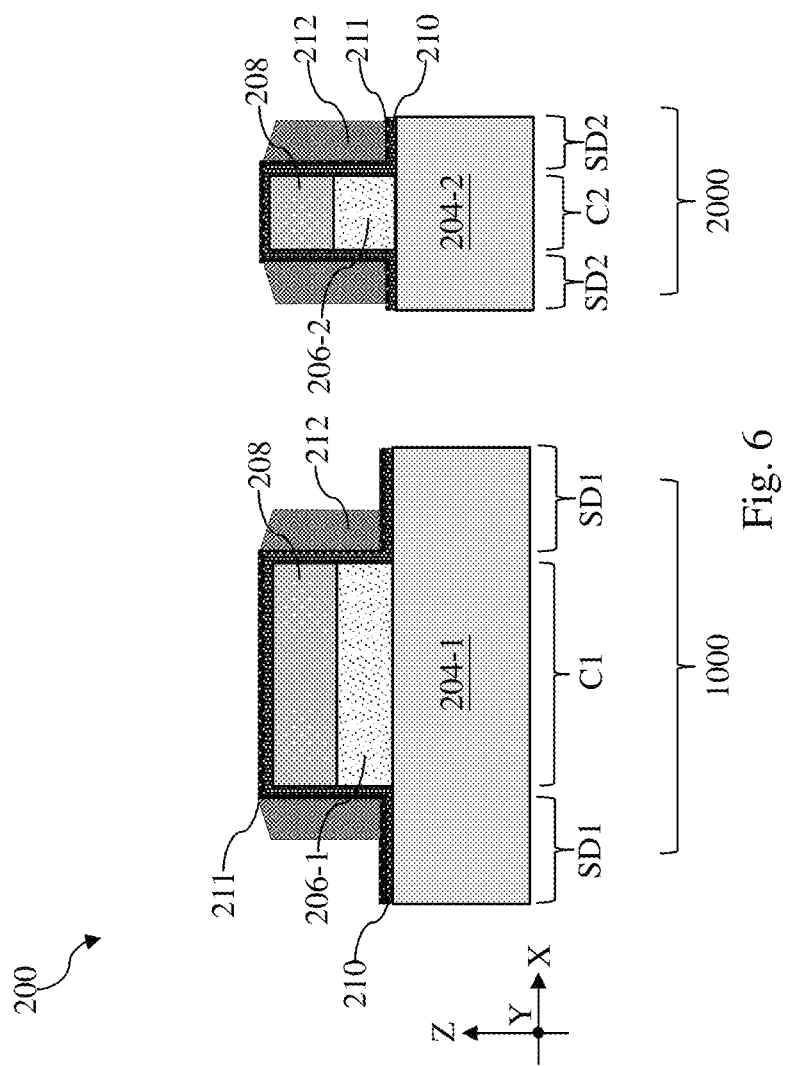

Referring to FIGS. 1 and 6, method 100 includes a block 112 where the third spacer material layer 212 is etched back. In some embodiments, at block 112, the workpiece 200 may be subjected to an anisotropic dry etch process, such as a reactive-ion etching (RIE). The anisotropic dry etch process at block 112 may remove portions of the third spacer material layer 212 that are deposited on top-facing surfaces of the second spacer material layer 211. The different composition of the third spacer material layer 212 allows selective etching thereof without substantially damaging the second spacer material layer 211. As shown in FIG. 6, operations at block 112 leave behind the third spacer material layer 212 along sidewalls of the first dummy gate stack 206-1 (as well as the gate-top hard mask 208 thereon) and the second dummy gate stack 206-2 (as well as the gate-top hard mask 208 thereon). In some implementations, the anisotropic dry etch process at block 112 may implement a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, oxygen, hydrogen, other suitable gases and/or plasmas, and/or combinations thereof.

Figure 7:
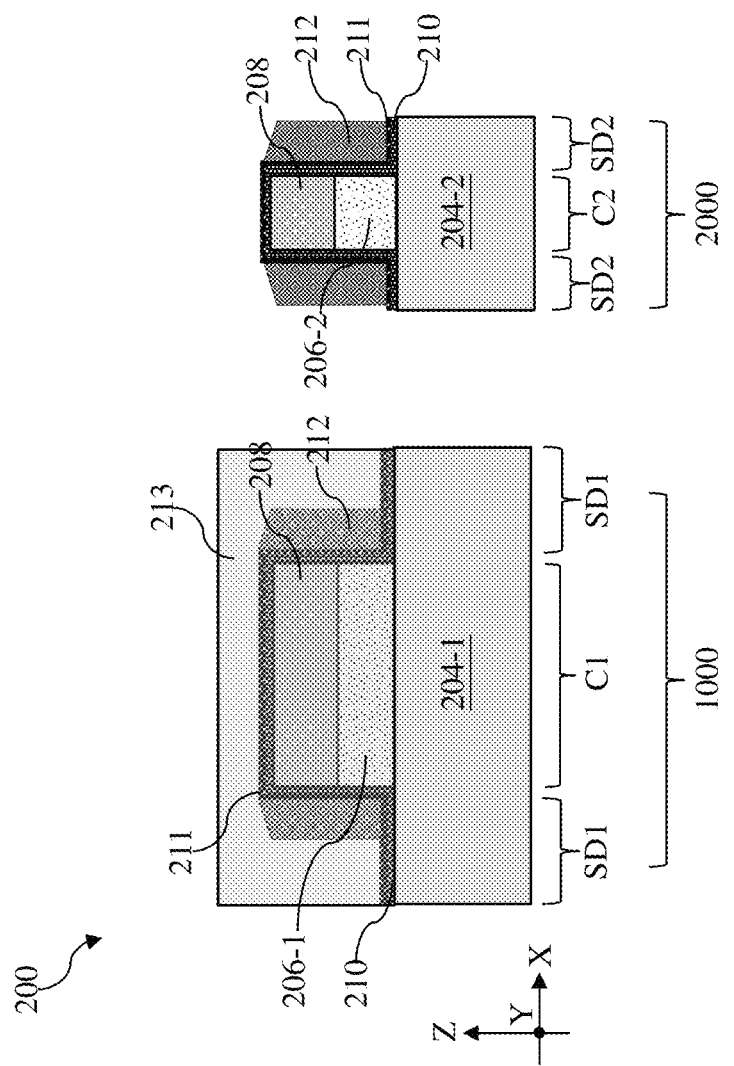

Referring to FIGS. 1 and 7, method 100 includes a block 114 where the third spacer material layer 212 in the second area 2000 is selectively removed. In some embodiments represented in FIG. 7, a photoresist mask 213 that covers the first area 1000 but exposes the second area 2000 is formed over the workpiece 200. In an example process, a photoresist layer is blanketly deposited over the workpiece 200 and patterned using a photolithography process. In this example process, after the deposition of the photoresist layer, the photoresist layer is soft-baked, exposed to radiation reflected from or transmitting through a photo mask, baked in a post-bake process, and developed in a developer solution. With the photoresist mask 213 protecting the first area 1000, the third spacer material layer 212 in the second area 2000 may be selectively removed using a selective wet etch process, a selective dry etch process, or a suitable selective etch process. An example selective wet etch process may include use of diluted hydrofluoric acid (DHF) or buffered hydrofluoric acid (BHF). Buffered hydrofluoric acid (BHF) here may include hydrofluoric acid (HF) and ammonia ($NH_3$).

Figure 8:
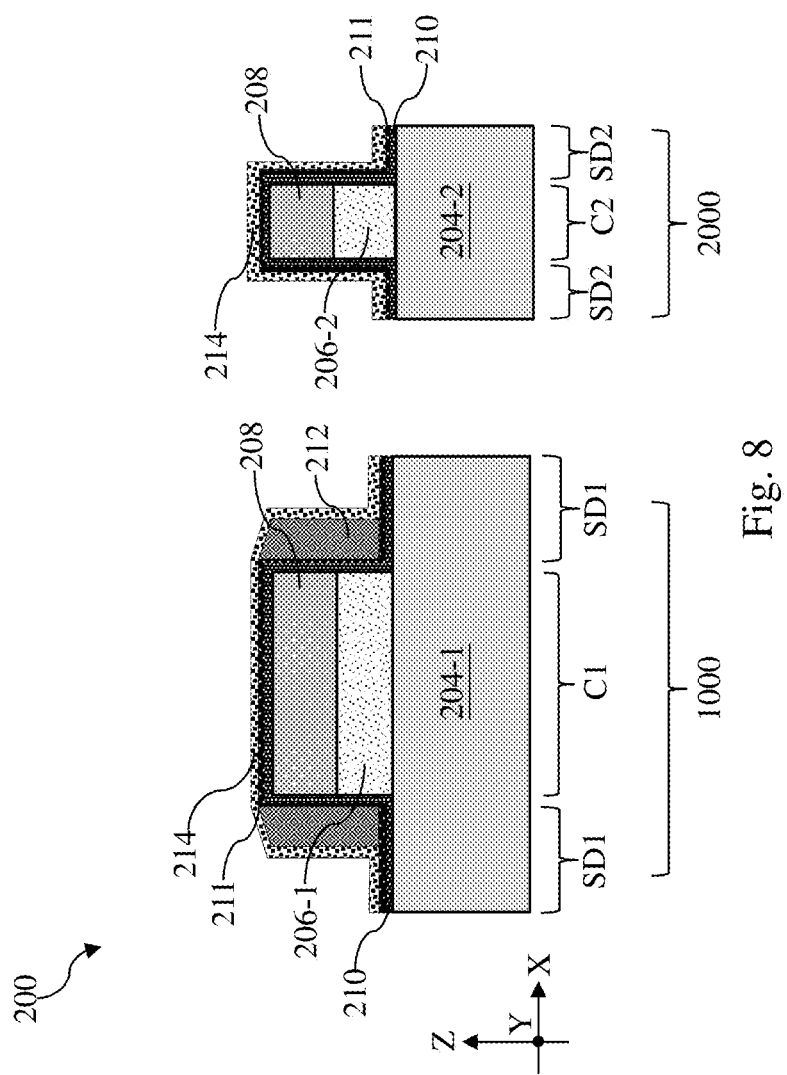

Referring to FIGS. 1 and 8, method 100 includes a block 116 wherein a fourth spacer material layer 214 is deposited over the workpiece 200. In some embodiments, the fourth spacer material layer 214 is more etch-resistant than the first spacer material layer 210, the second spacer material layer 211, and the third spacer material layer 212. It is observed that etch resistant is, in general, positively correlated to dielectric constant. That is, the dielectric constant of the fourth spacer material layer 214 is greater than that of the first spacer material layer 210, the second spacer material layer 211, or the third spacer material layer 212. The fourth spacer material layer 214 may include silicon and nitrogen and may be free of oxygen. In one embodiment, the fourth spacer material layer 214 may be formed of silicon nitride (SiN). In some implementations, the fourth spacer material layer 214 may be deposited over the second spacer material layer 211 (in the first area 1000 and the second area 2000) and the third spacer material layer 212 (in the first area 1000) using CVD process, an SACVD process, an ALD process, a PVD process, or other suitable process. In some instances, the fourth spacer material layer 214 has a thickness between about 4.5 nm and about 6 nm. Out of the first spacer material layer 210, the second spacer material layer 211, the third spacer material layer 212, and the fourth spacer material layer 214, the fourth spacer material layer 214 has the greatest etch resistance and dielectric constant. Although its high etch resistance may be desirable, the high dielectric constant of the fourth spacer material layer 214 may lead to increased parasitic capacitance between the gate structures and adjacent source/drain contacts. For these reasons, a thickness of the fourth spacer material layer 214 of the present disclosure is minimized and is selected to meet process attributes—such as etchant species, etch conditions, etch duration, or desired source/drain trench dimensions.

Figure 9:
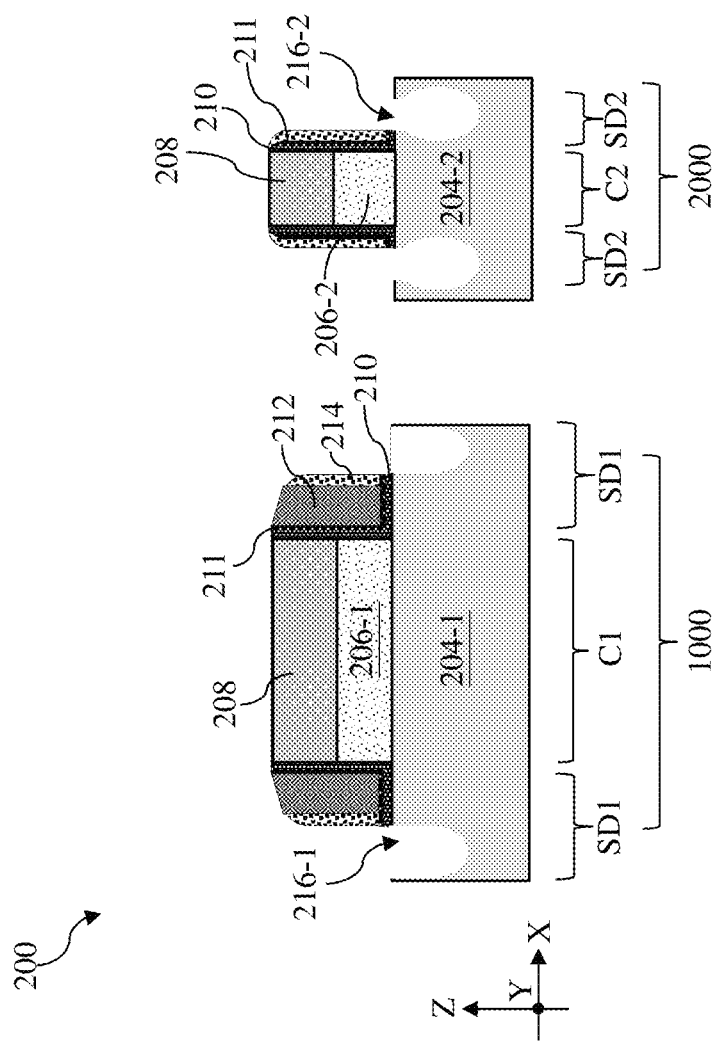

Referring to FIGS. 1 and 9, method 100 includes a block 118 where first source/drain trenches 216-1 are formed in the first area 1000 and second source/drain trenches 216-2 are formed in the second area 2000. At block 118, the first source/drain regions SD1 and the second source/drain regions SD2 that are not protected by the first dummy gate stack 206-1, the second dummy gate stack 206-2, and the spacer material layers are recessed to form the first source/drain trenches 216-1 in the first area 1000 and the second source/drain trenches 216-2 in the second area 2000. Operations at block 118 may be performed using an anisotropic dry etch process. In some implementations, the anisotropic dry etch process at block 118 may implement a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, oxygen, hydrogen, other suitable gases and/or plasmas, and/or combinations thereof. As shown in FIG. 9, the anisotropic dry etch process not only forms the first source/drain trenches 216-1 and the second source/drain trenches 216-2, but also removes the fourth spacer material layer 214, the second spacer material layer 211, and the first spacer material layer 210 from the top surfaces of the gate-top hard mask 208.

Figure 10:
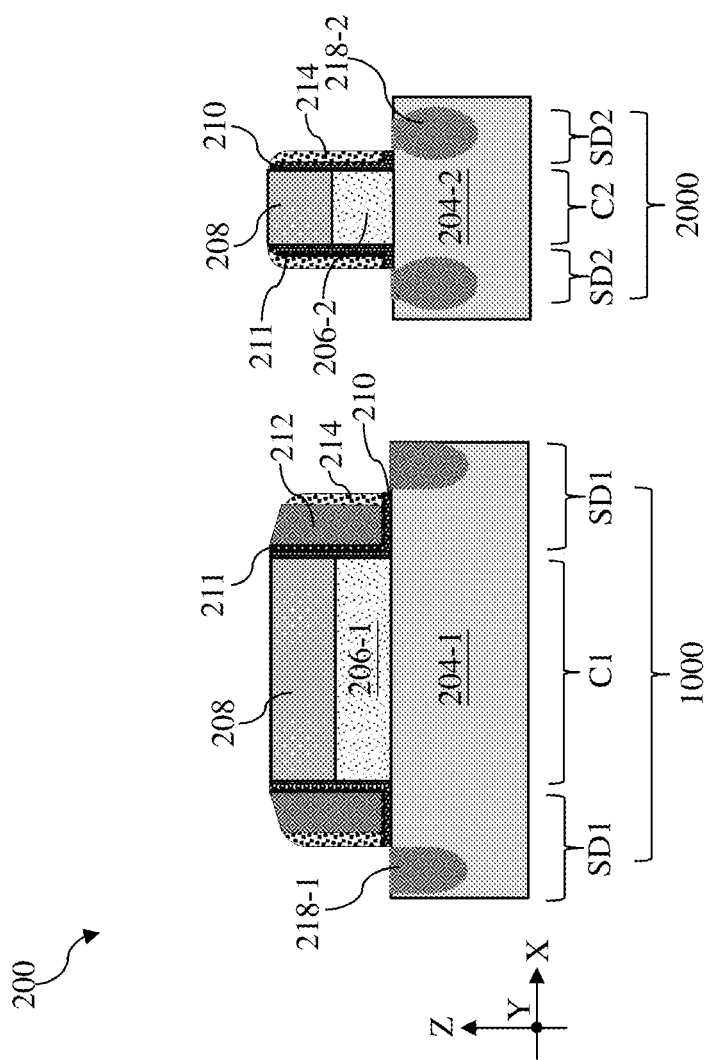

Referring to FIGS. 1 and 10, method 100 includes a block 120 where first source/drain features 218-1 are formed in the first source/drain trenches 216-1 and second source/drain features 218-2 are formed in the second source/drain trenches 216-2. The first source/drain features 218-1 and the second source/drain features 218-2 may be formed by one or more epitaxy processes. To provide a clean surface for epitaxial growth, a cleaning process may be performed to clean the first source/drain trenches 216-1 and the second source/drain trenches 216-2 with a hydrofluoric acid (HF) solution or other suitable solution. Subsequently, one or more epitaxial growth processes are performed to grow epitaxial features in the first source/drain trenches 216-1 and the second source/drain trenches 216-2. The first source/drain features 218-1 and second source/drain features 218-2 may be suitable either for a p-type metal-oxide-semiconductor (PMOS) device (e.g., including a p-type epitaxial material) or alternatively, an n-type MOS (NMOS) device (e.g., including an n-type epitaxial material). The p-type epitaxial material may include one or more epitaxial layers of silicon germanium (SiGe), where the silicon germanium is doped with a p-type dopant such as boron, germanium, indium, and/or other p-type dopants. The n-type epitaxial material may include one or more epitaxial layers of silicon (Si) or silicon carbon (SiC), where the silicon or silicon carbon is doped with an n-type dopant such as arsenic, phosphorus, and/or other n-type dopants. In some implementations, each of the epitaxial growth processes may include different in-situ doping levels of suitable dopants.

The epitaxial growth processes to form the first source/drain features 218-1 and second source/drain features 218-2 may include vapor-phase epitaxy (VPE), ultra-high vacuum CVD (UHV-CVD), a cyclic deposition and etching (CDE) process, molecular beam epitaxy (MBE), and/or other suitable processes.

Figure 11:
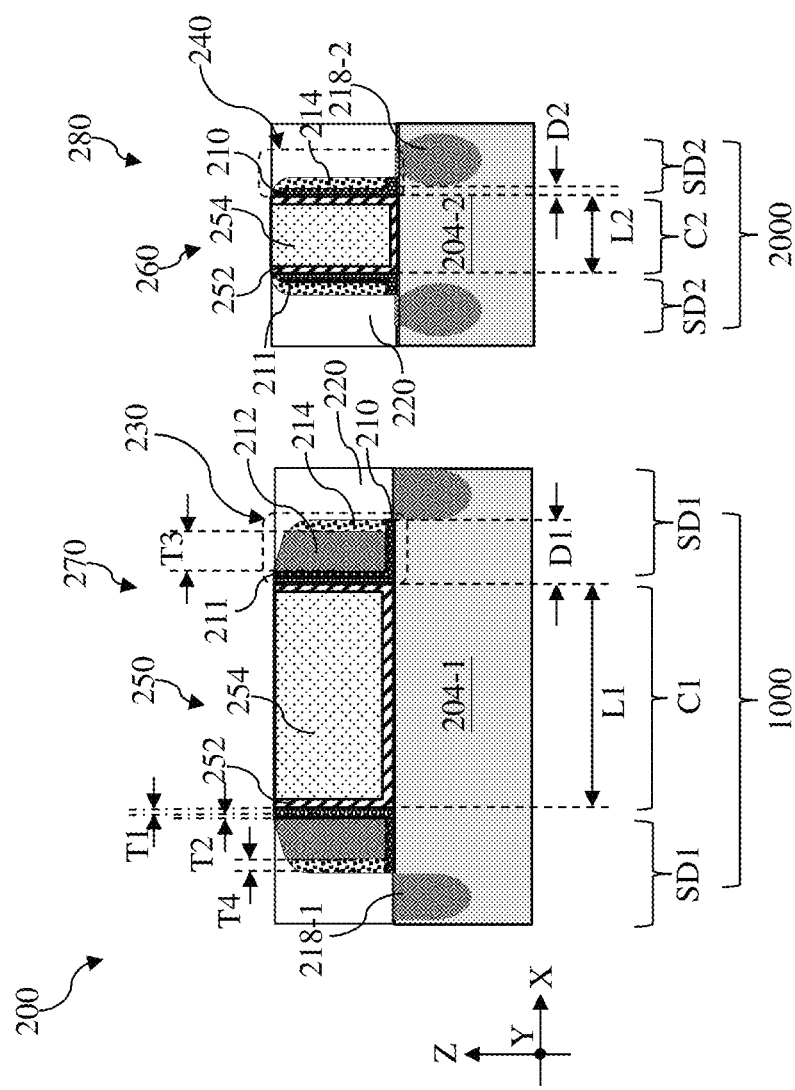
Figure 12:
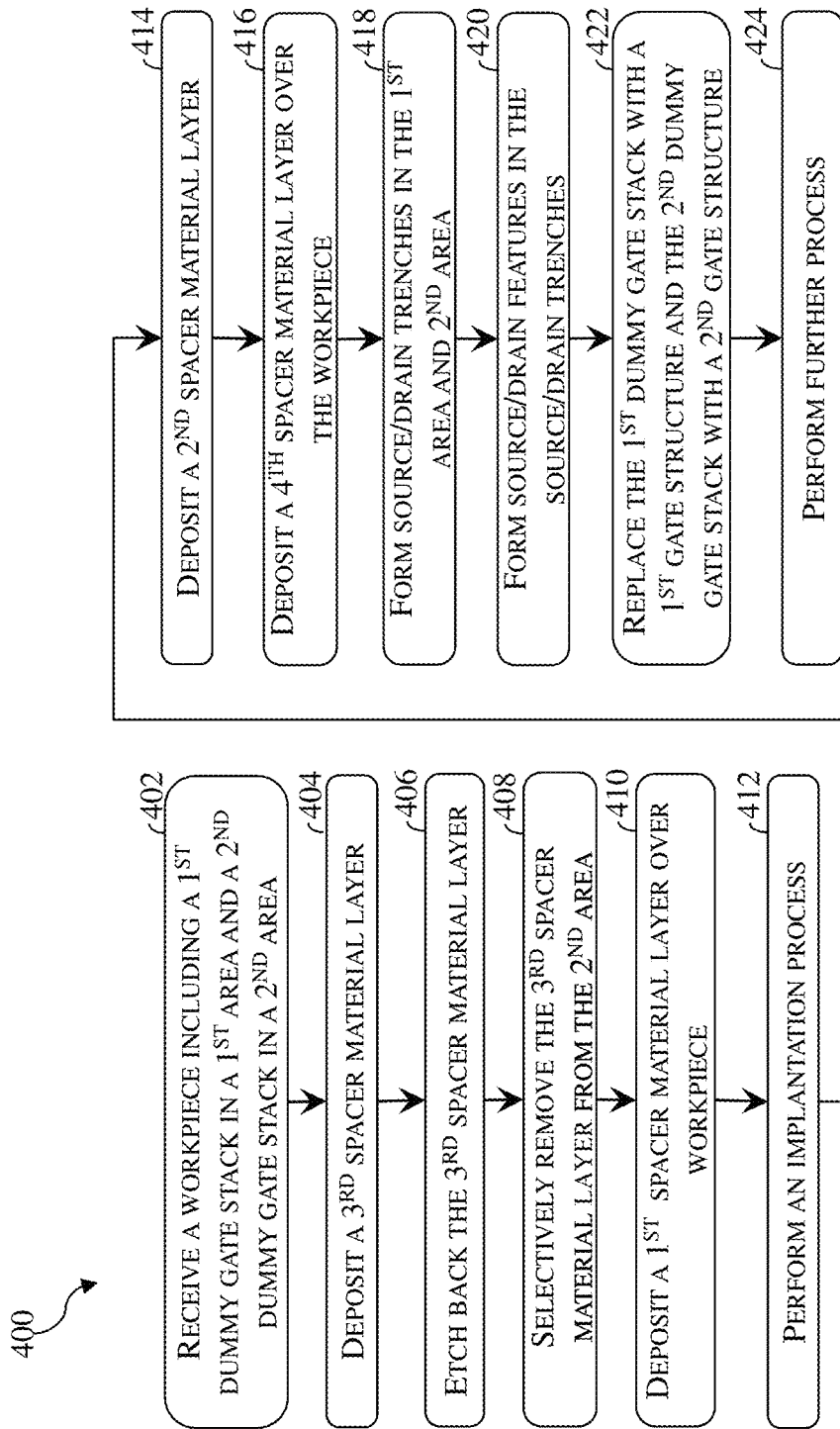
FIG. 12 is a flowchart of another method of fabricating a semiconductor device, according to various aspects of the present disclosure.

Referring to FIGS. 1 and 11, method 100 includes a block 122 where the first dummy gate stack 206-1 is replaced with a first gate structure 250 and the second dummy gate stack 206-2 is replaced with a second gate structure 260. In some embodiments, a gate replacement process or a gate last process is adopted and the first dummy gate stack 206-1 and the second dummy gate stack 206-2 are replaced with a first gate structure 250 and a second gate structure 260. The gate replacement process may be performed simultaneously to all of the first dummy gate stack 206-1 in the first area 1000 and the second dummy gate stack 206-2 in the second area 2000. Upon conclusion of the gate replacement, the first gate structure 250 is disposed over the first channel region C1 of the first fin structure 204-1 in the first area 1000 and the second gate structure 260 is disposed over the second channel region C2 of the second fin structure 204-2 in the second area 2000.

To replace the dummy gate stacks with gate structures, an interlayer dielectric (ILD) layer 220 is formed over the workpiece 200, including over the first source/drain features 218-1 and the second source/drain features 218-2. A contact etch stop layer (CESL) (not shown) may be deposited over the workpiece 200 before the deposition of the ILD layer 220. A planarization process is then performed to the workpiece 200 to remove the gate-top hard mask 208 and to expose top surfaces of the first dummy gate stack 206-1 and the second dummy gate stack 206-2. In instances where the first dummy gate stack 206-1 and the second dummy gate stack 206-2 are formed of polysilicon, an etch process that is selective to polysilicon may be used to remove the first dummy gate stack 206-1 and the second dummy gate stack 206-2 to expose the first channel region C1 and the second channel region C2, without substantially damaging the first gate spacers 230, the second gate spacers 240, and the ILD layer 220. In some embodiments, each of the first gate structure 250 and the second gate structure 260 includes a gate dielectric layer 252 and a gate electrode 254. The gate dielectric layer 252 may include an interfacial layer and one or more high-k dielectric layers (i.e., having a dielectric constant greater than that of silicon oxide, which is about 3.9) over the interfacial layer. In some implementations, the interfacial layer may include silicon oxide and the high-k dielectric layer may include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof. The interfacial layer functions to enhance adhesion of the high-k dielectric layers to the first channel region C1 and the second channel region C2. The gate electrode 254 may include at least one work function metal layer and a metal fill layer disposed thereover. Depending on the conductivity type of the devices in the first area 1000 and the devices in the second area 2000, the work function metal layer may be a p-type or an n-type work function metal layer. Exemplary work function materials include TiN, TaN, Ru, Mo, Al, WN, $ZrSi_2$, $MoSi_2$, $TaSi_2$, $NiSi_2$, Ti, Ag, TaAl, TaAlC, TiAlN, TaC, TaCN, TaSiN, Mn, Zr, other suitable work function materials, or combinations thereof. The metal fill layer may include copper (Cu), tungsten (W), aluminum (Al), cobalt (Co), other suitable materials, or combinations thereof and may be deposited using physical vapor deposition (PVD), CVD, ALD, or other suitable processes.

Reference is still made to FIG. 11. Upon conclusion of the operations at block 122, a first transistor 270 and a second transistor 280 are substantially formed. The first transistor 270 may be an I/O FinFET in the first area 1000 and the second transistor 280 may be a core FinFET in the second area 2000. The first transistor 270 includes first gate spacers 230 disposed along sidewalls of the first gate structure 250. The second transistor 280 includes second gate spacers 240 disposed along sidewalls of the second gate structure 260 in the second area 2000. Each of the first gate spacers 230 includes the first spacer material layer 210, the second spacer material layer 211, the third spacer material layer 212, and the fourth spacer material layer 214. Each of the second gate spacers 240 includes the first spacer material layer 210, the second spacer material layer 211, and the fourth spacer material layer 214. Compared to the first gate spacer 230, the second gate spacer 240 does not include the third spacer material layer 212, which is a thickness booster layer. In the first gate spacers 230 and the second gate spacers 240, the first spacer material layer 210 takes up a first thickness T1, the second spacer material layer 211 takes up a second thickness T2, the third spacer material layer 212 takes up a third thickness T3, and the fourth spacer material layer 214 takes up a fourth thickness T4. The first thick T1 is similar to the as-deposited thickness of the first spacer material layer 210 and is between about 2.5 nm and about 3.0 nm. The second thick T2 is similar to the as-deposited thickness of the second spacer material layer 211 and is between about 2.5 nm and about 3.0 nm. The third thick T3 is smaller than the as-deposited thickness of the third spacer material layer 212 and is between about 7 nm and about 19 nm. The fourth thick T4 is smaller than the as-deposited thickness of the fourth spacer material layer 214 and is between about 4 nm and about 5.5 nm. As a result, a thickness of a first gate spacer 230 along the X direction may be between about 14 nm and about 30 nm and a thickness of a second gate spacer 240 along the X direction may be between about 9 nm and about 12 nm. As illustrated in FIG. 11, a first channel length L1 may be between about 74 nm and about 6 μm (6000 nm) and the second channel length L2 may be less than 74 nm. The first gate spacer 230 helps space the first channel region C1 apart from the first source/drain feature 218-1 by a first distance D1. The first distance D1 may be similar to the thickness of the first gate spacer 230 when the first source/drain feature 218-1 does not undercut the first gate spacer 230. The first distance D1 spans across the LDD zone formed at block 116. The second gate spacer 240 helps space the second channel region C2 apart from the second source/drain feature 218-2 by a second distance D2. The second distance D2 may be similar to the thickness of the second gate spacer 240 when the second source/drain feature 218-2 does not undercut the second gate spacer 240. The second distance D2 spans across the LDD zone formed at block 116. In some instances represented in FIG. 11, the second source/drain feature 218-2 undercuts the second gate spacer 240 and the second distance D2 is smaller than the thickness of the second gate spacer 240. Because of the longer first channel length L1 and the thicker first gate spacer 230, the first transistor 270 may have an operating voltage between about 3.3 V and about 5.0 V, making it suitable for high-voltage or I/O applications.

Referring to FIG. 1, method 100 includes a block 124 where further processes are performed. Such further processes may include deposition of a capping layer over the workpiece, formation of a further interlayer dielectric layer over the capping layer, formation of gate contacts in contact with the first gate structure 250 and the second gate structure 260, recess of the first source/drain features 218-1 and the second source/drain features 218-2, formation of silicide features over the first source/drain features 218-1 and the second source/drain features 218-2, and formation of source/drain contacts in contact with the first source/drain features 218-1 and the second source/drain features 218-2. These further processes form conductive features that interconnect various nodes and devices in the semiconductor device 200.

Besides method 100, the present disclosure also provides an alternative method 400 shown in FIG. 12 and an alternative method 500 shown in FIG. 23. Similar to method 100, the alternative methods 400 and 500 provide different gate spacers for a transistor in the first area 1000 and a transistor in the second area 2000. For example, the gate spacers in the first area 1000 include a thickness booster layer and the gate spacers in the second area 2000 are free of the thickness booster layer.

Figure 13:
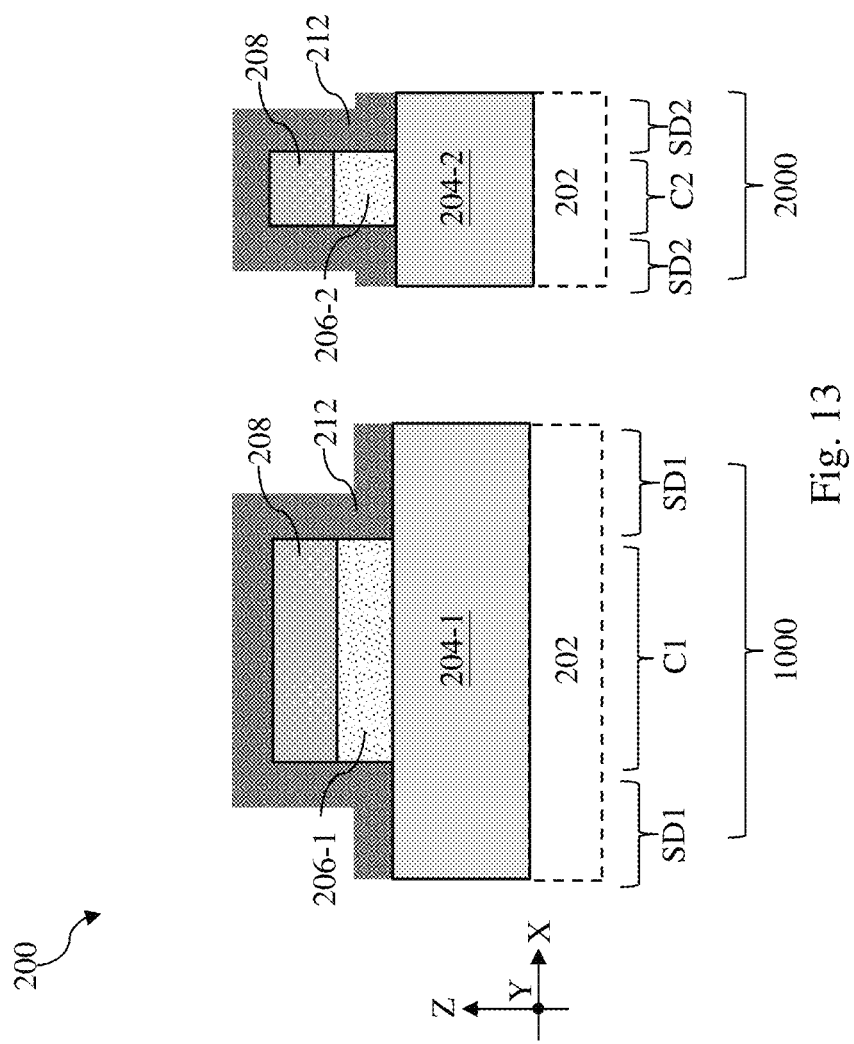
FIGS. 13-22 are fragmentary cross-sectional views of a workpiece undergoing various operations of the method in FIG. 12, according to various aspects of the present disclosure.

Referring to FIGS. 12 and 13, method 400 includes a block 402 where a workpiece 200 is received. As shown in FIG. 13, the workpiece 200 includes a substrate 202, a first fin structure 204-1 over a first area 1000 of the substrate 202, a second fin structure 204-2 over a second area 2000 of the substrate 202, a first dummy gate stack 206-1 over the first fin structure 204-1, and a second dummy gate stack 206-2 over the second fin structure 204-2. Because the workpiece 200 have been described above with respect to block 102 of method 100, detailed descriptions of the workpiece 200 is omitted for brevity. For simplicity, the substrate 202 is only schematically shown in FIG. 13 and is omitted from FIGS. 14-22 for simplicity.

Referring to FIGS. 12 and 13, method 400 includes a block 404 where a third spacer material layer 212 is deposited over the workpiece 200. The third spacer material layer 212 is formed of a dielectric material that is different from the fin structures, the first spacer material layer 210, the second spacer material layer 211, and the fourth spacer material 214. As such, its different composition allows selective removal of the third spacer material layer 212 without damaging adjacent structures. As the composition and formation of the third spacer material layer 212 has been described above, detailed description of the third spacer material layer 212 is omitted for brevity. In method 400, the third spacer material layer 212 may serve as a thickness booster. In this regard, the third spacer material layer 212 may also be referred to as a thickness booster layer. In some instances, the thickness of the third spacer material layer 212 may be between about 8 nm and about 20 nm. By design of the present disclosure, the third spacer material layer 212 has a low dielectric constant in order to increase thickness without increasing the dielectric constant.

Figure 14:
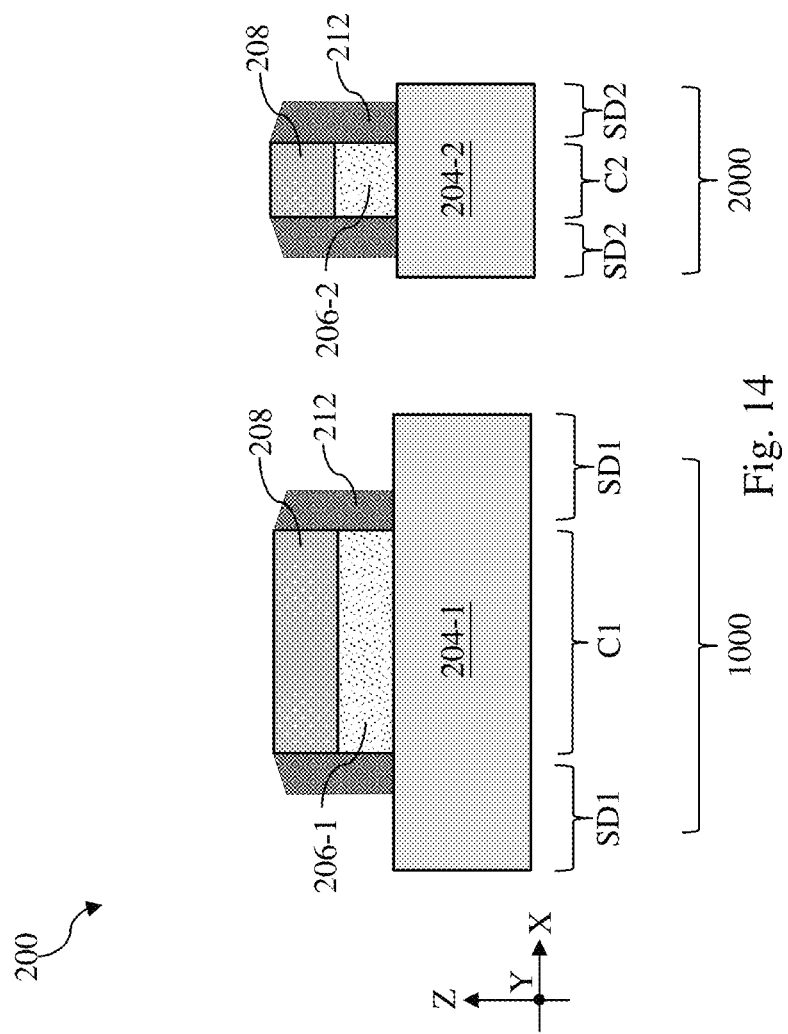

Referring to FIGS. 12 and 14, method 400 includes a block 406 where the third spacer material layer 212 is etched back. In some embodiments, at block 406, the workpiece 200 may be subjected to an anisotropic dry etch process, such as a reactive-ion etching (RIE). The anisotropic dry etch process at block 406 may remove portions of the third spacer material layer 212 that are deposited on top-facing surfaces of the first fin structure 204-1 and the second fin structure 204-2. The different composition of the third spacer material layer 212 allows selective etching thereof without substantially damaging the first fin structure 204-1, the second fin structure 204-2, and the gate-top hard mask 208. As shown in FIG. 14, operations at block 406 leave behind the third spacer material layer 212 along sidewalls of the first dummy gate stack 206-1 (as well as the gate-top hard mask 208 thereon) and the second dummy gate stack 206-2 (as well as the gate-top hard mask 208 thereon). In some implementations, the anisotropic dry etch process at block 406 may implement a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, oxygen, hydrogen, other suitable gases and/or plasmas, and/or combinations thereof.

Figure 15:
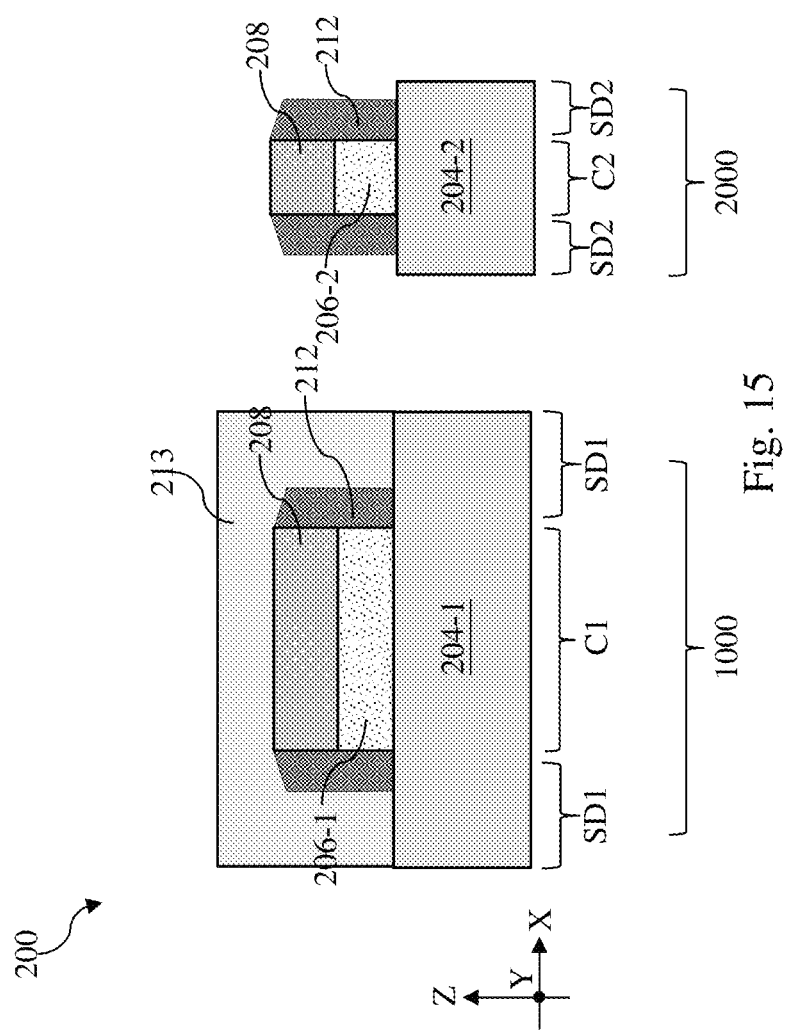

Referring to FIGS. 12 and 15, method 400 includes a block 408 where the third spacer material layer 212 in the second area 2000 is selectively removed. In some embodiments represented in FIG. 15, a photoresist mask 213 that covers the first area 1000 but exposes the second area 2000 is formed over the workpiece 200. In an example process, a photoresist layer is blanketly deposited over the workpiece 200 and patterned using a photolithography process. With the photoresist mask 213 protecting the first area 1000, the third spacer material layer 212 in the second area 2000 may be selectively removed using a selective wet etch process, a selective dry etch process, or a suitable selective etch process. An example selective wet etch process may include use of diluted hydrofluoric acid (DHF) or buffered hydrofluoric acid (BHF). Buffered hydrofluoric acid (BHF) here may include hydrofluoric acid (HF) and ammonia ($NH_3$).

Figure 16:
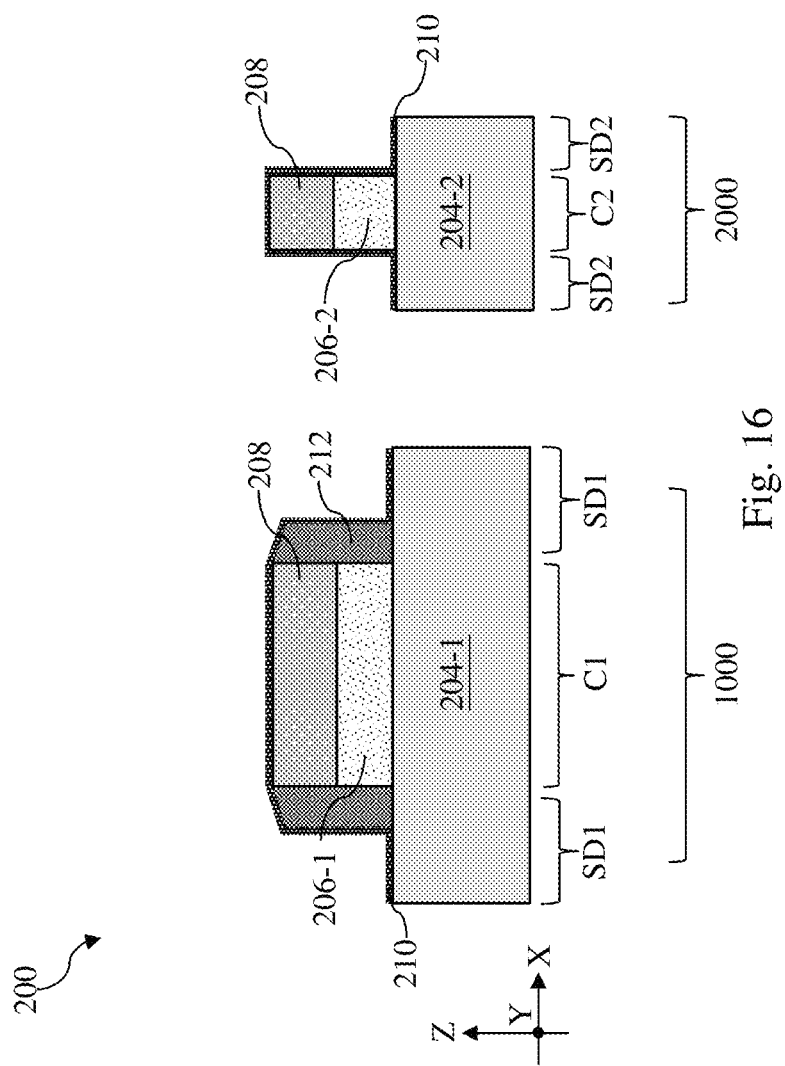

Referring to FIGS. 12 and 16, method 400 includes a block 410 where a first spacer material layer 210 is deposited over the workpiece 200. In some embodiments, the first spacer material layer 210 may include silicon, oxygen, carbon and nitrogen. In one embodiment, the first spacer material layer 210 may include silicon oxycarbonitride (SiOCN). The first spacer material layer 210 may have a dielectric constant similar to that of a silicon oxide layer. In some implementations, the first spacer material layer 210 may be deposited on the gate-top hard mask 208, surfaces of the third spacer material layer 212 and the first fin structure 204-1 in the first area 1000. In the second area 2000, the first spacer material layer 210 may be deposited on surfaces of the gate-top hard mask 208, sidewalls of the second dummy gate stack 206-2 and the second fin structure 204-2. The first spacer material layer 210 may be deposited using CVD process, a subatmospheric CVD (SACVD) process, an ALD process, a PVD process, or other suitable process. In some implementations, the first spacer material layer 210 may have a thickness between about 2.5 nm and about 3.0 nm.

Figure 17:
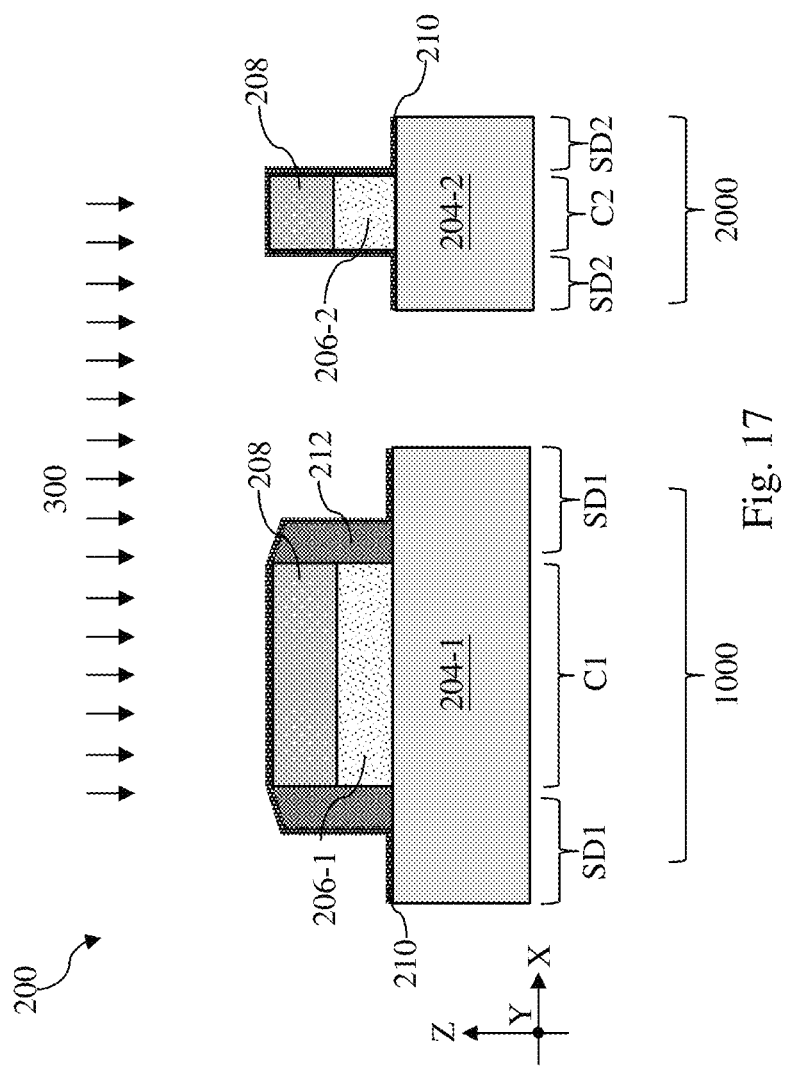

Referring to FIGS. 12 and 17, method 400 includes a block 412 where an implantation process 300 is performed. In some embodiments, the implantation process 300 is performed to form lightly doped source/drain (LDD) zones (not shown) over the first source/drain region SD1 and the second source/drain regions SD2. The implantation process 300 may utilize n-type dopants, such as phosphorus (P) or arsenic (As), for n-type field effect transistors (NFETs), or p-type dopants, such as boron (B) or indium (In), for p-type field effect transistors (PFETs). For example, operations at block 412 may implant n-type dopant(s) into the first source/drain region SD1 and the second source/drain regions SD2. The LDD regions are self-aligned with first dummy gate stack 206-1 and the second dummy gate stack 206-2. In some implementations, the first spacer material layer 210 serves as a screen layer or protective layer to control the thickness of the LDD zones and to reduce surface damages. Although not explicitly shown in the figures, after the implantation process 300, the workpiece 200 is annealed to activate the implanted ions in the LDD zones.

Figure 18:
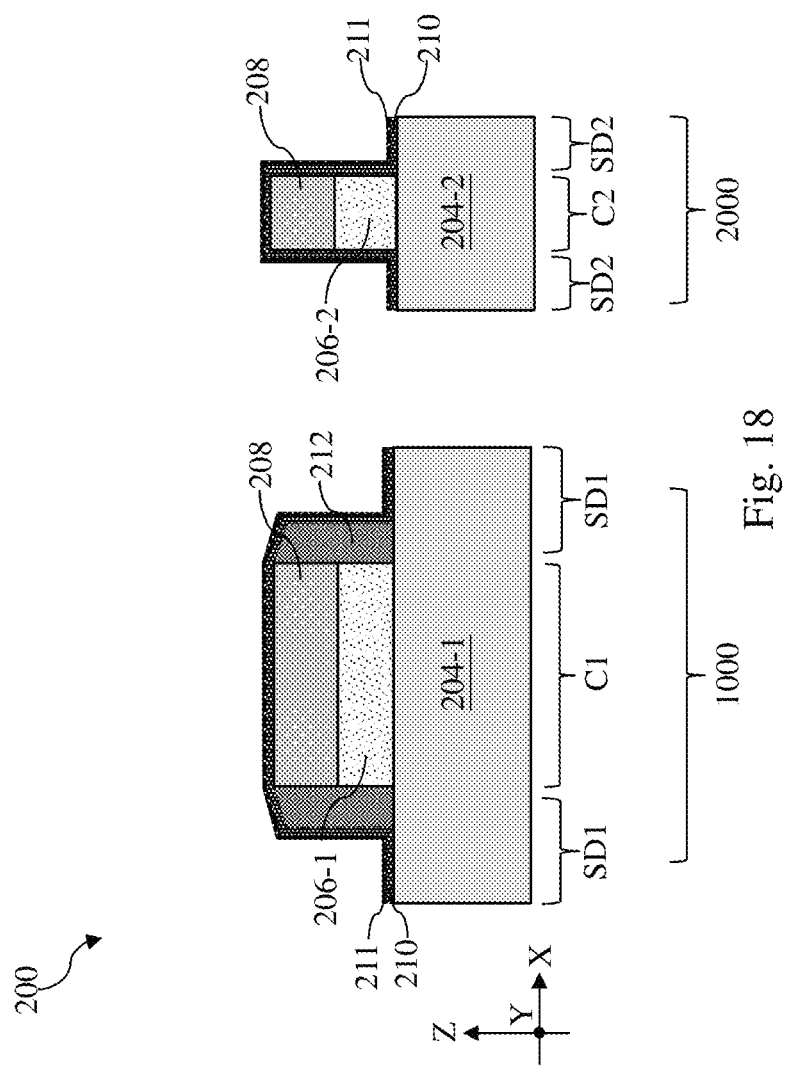

Referring to FIGS. 12 and 18, method 400 includes a block 414 where a second spacer material layer 211 is deposited over the first spacer material layer 210. In some embodiments, the second spacer material layer 211 and the first spacer material layer 210 may have the same composition. In these embodiments, the second spacer material layer 211 may include silicon, oxygen, carbon and nitrogen. In one embodiment, the second spacer material layer 211 may include silicon oxycarbonitride (SiOCN). The second spacer material layer 211 may have a dielectric constant similar to that of a silicon oxide layer. In some implementations, the second spacer material layer 211 may be deposited over the first spacer material layer 210 using CVD process, an SACVD process, an ALD process, a PVD process, or other suitable process. In some implementations, the second spacer material layer 211 may have a thickness similar to that of the first spacer material layer 210. In some instances, the thickness of the second spacer material layer 211 may be between about 2.5 nm and about 3.0 nm.

Figure 19:
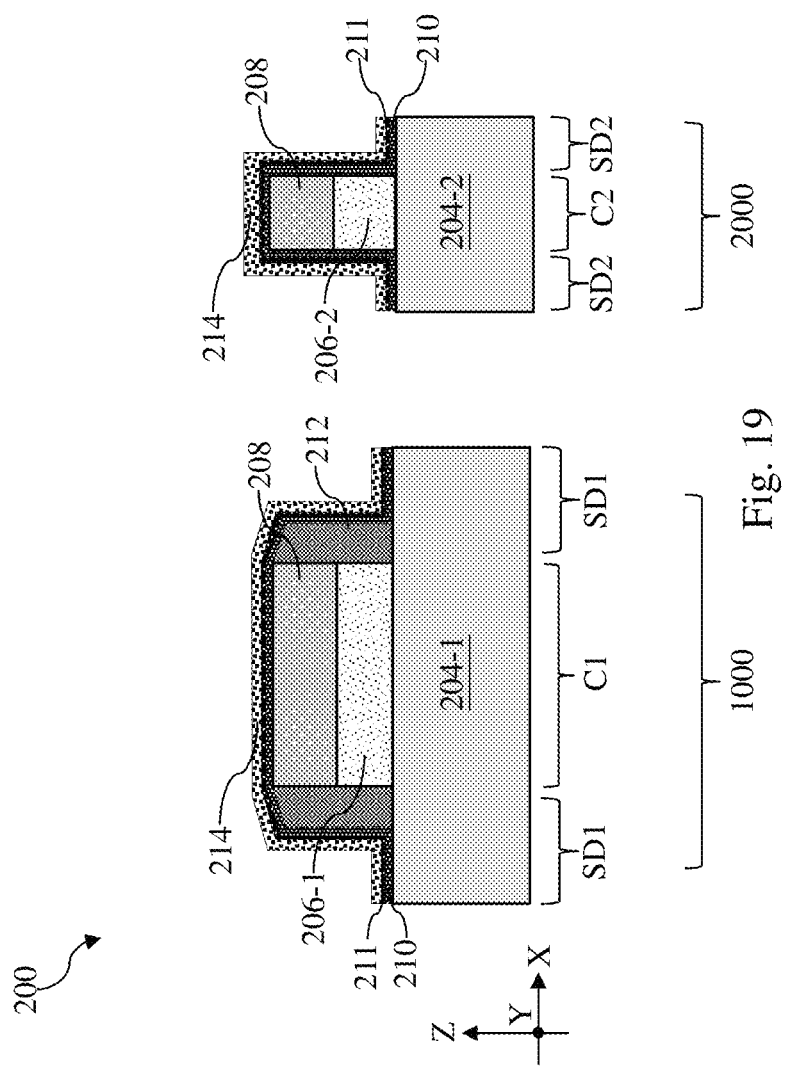

Referring to FIGS. 12 and 19, method 400 includes a block 416 wherein a fourth spacer material layer 214 is deposited on the second spacer material layer 211. In some embodiments, the fourth spacer material layer 214 is more etch-resistant than the first spacer material layer 210, the second spacer material layer 211, and the third spacer material layer 212. It is observed that etch resistant is, in general, positively correlated to dielectric constant. That is, the dielectric constant of the fourth spacer material layer 214 is greater than that of the first spacer material layer 210, the second spacer material layer 211, or the third spacer material layer 212. The fourth spacer material layer 214 may include silicon and nitrogen and may be free of oxygen. In one embodiment, the fourth spacer material layer 214 may be formed of silicon nitride (SiN). In some implementations, the fourth spacer material layer 214 may be deposited over the second spacer material layer 211 using CVD process, an SACVD process, an ALD process, a PVD process, or other suitable process. In some instances, the fourth spacer material layer 214 has a thickness between about 4.5 nm and about 6 nm.

Figure 20:
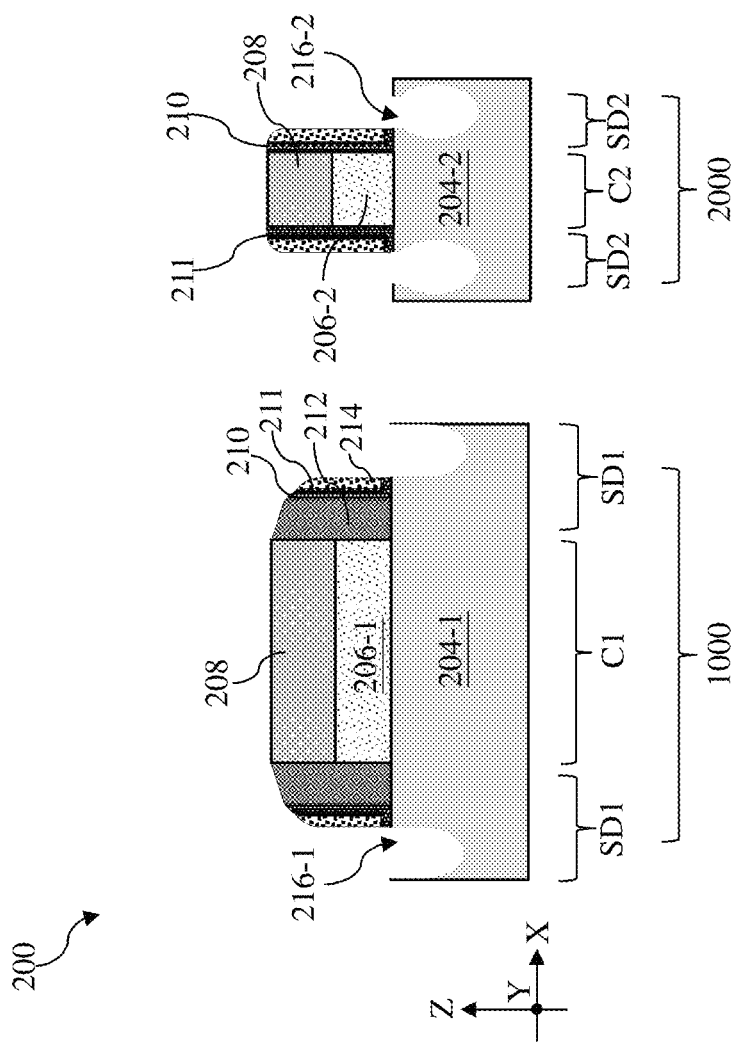

Referring to FIGS. 12 and 20, method 400 includes a block 418 where first source/drain trenches 216-1 are formed in the first area 1000 and second source/drain trenches 216-2 are formed in the second area 2000. At block 418, the first source/drain regions SD1 and the second source/drain regions SD2 that are not protected by the first dummy gate stack 206-1, the second dummy gate stack 206-2, and the spacer material layers are recessed to form the first source/drain trenches 216-1 in the first area 1000 and the second source/drain trenches 216-2 in the second area 2000. Operations at block 418 may be performed using an anisotropic dry etch process. In some implementations, the anisotropic dry etch process at block 418 may implement a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, oxygen, hydrogen, other suitable gases and/or plasmas, and/or combinations thereof. As shown in FIG. 20, the anisotropic dry etch process not only forms the first source/drain trenches 216-1 and the second source/drain trenches 216-2, but also removes the fourth spacer material layer 214, the second spacer material layer 211, and the first spacer material layer 210 from the top surfaces of the gate-top hard mask 208.

Figure 21:
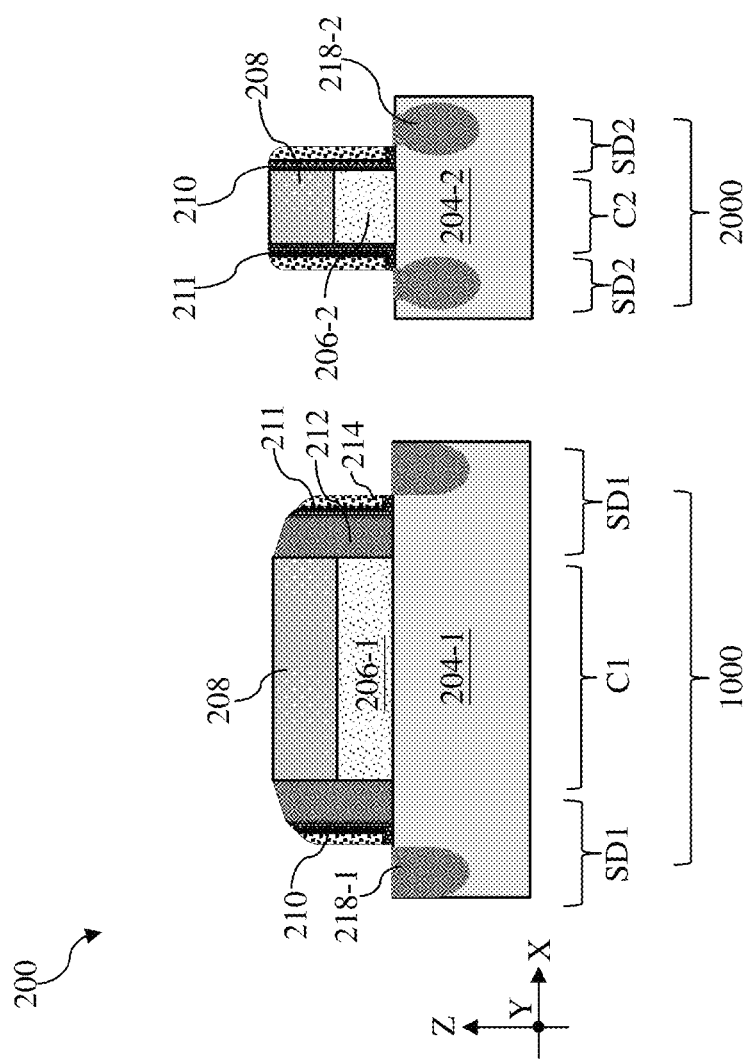

Referring to FIGS. 12 and 21, method 400 includes a block 420 where first source/drain features 218-1 are formed in the first source/drain trenches 216-1 and second source/drain features 218-2 are formed in the second source/drain trenches 216-2. As the first source/drain features 218-1 and the second source/drain features 218-2 have been described above with respect to block 120, detailed descriptions thereof are omitted here for brevity.

Figure 22:
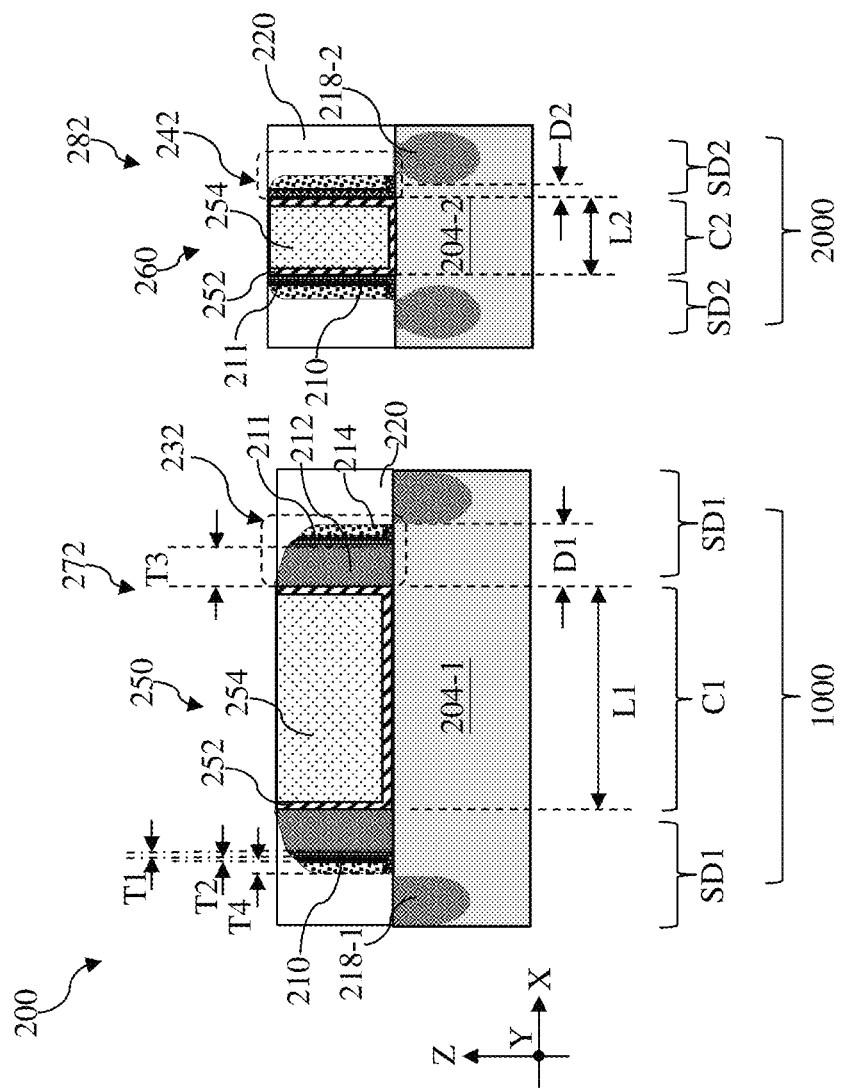
Figure 23:
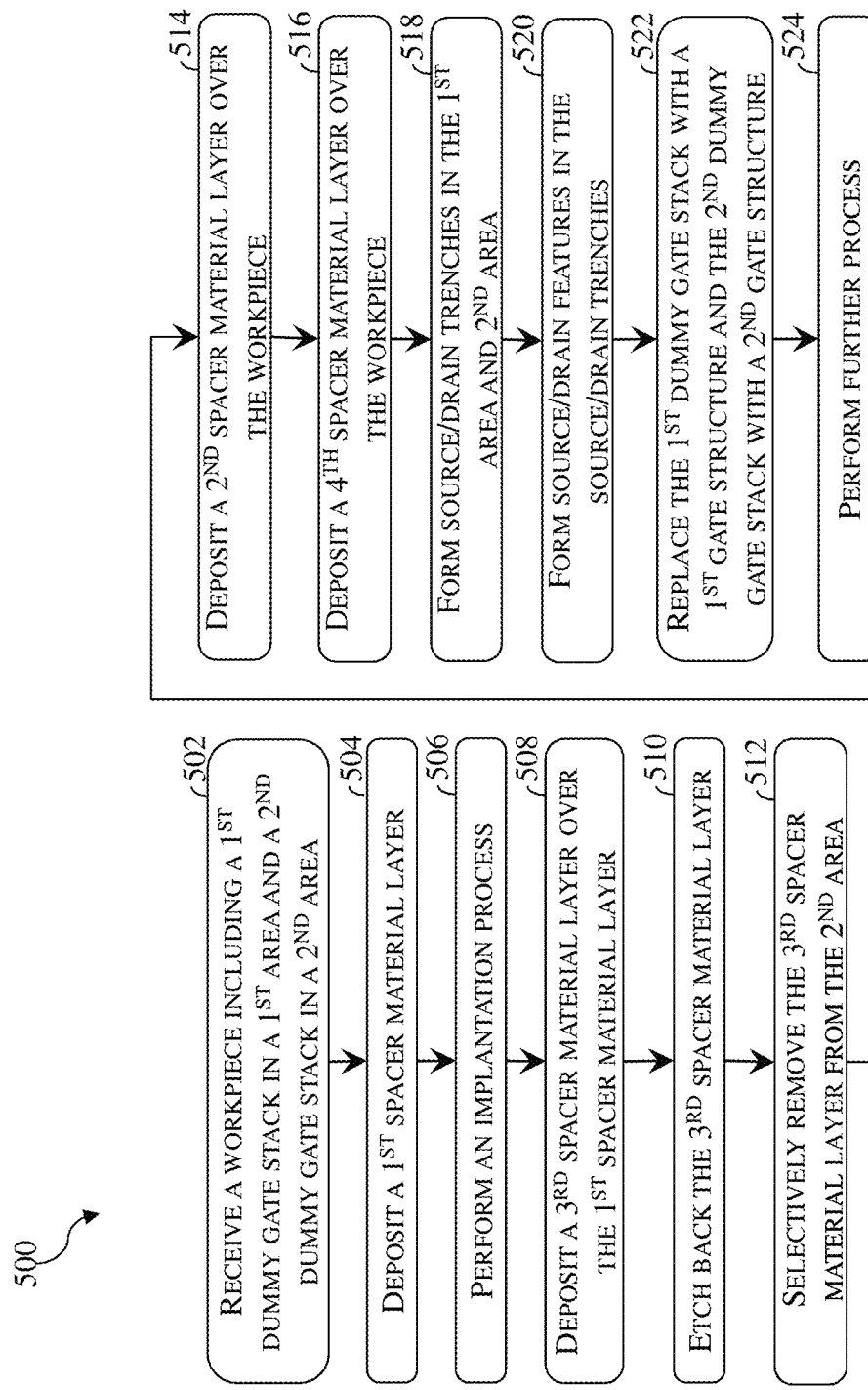
FIG. 23 is a flowchart of an alternative method of fabricating a semiconductor device, according to various aspects of the present disclosure.

Referring to FIGS. 12 and 22, method 400 includes a block 422 where the first dummy gate stack 206-1 is replaced with a first gate structure 250 and the second dummy gate stack 206-2 is replaced with a second gate structure 260. As the first gate structure 250 and the second gate structure 260 have been described above with respect to block 122, detailed descriptions thereof are omitted here for brevity.

Reference is still made to FIG. 22. Upon conclusion of the operations at block 422, a third transistor 272 and a fourth transistor 282 are substantially formed. The third transistor 272 may be an I/O FinFET in the first area 1000 and the fourth transistor 282 may be a core FinFET in the second area 2000. The third transistor 272 includes third gate spacers 232 disposed along sidewalls of the first gate structure 250. The fourth transistor 282 includes fourth gate spacers 242 disposed along sidewalls of the second gate structure 260 in the second area 2000. Each of the third gate spacers 232 includes the first spacer material layer 210, the second spacer material layer 211, the third spacer material layer 212, and the fourth spacer material layer 214. Each of the fourth gate spacers 242 includes the first spacer material layer 210, the second spacer material layer 211, and the fourth spacer material layer 214. Compared to the third gate spacer 232, the fourth gate spacer 242 does not include the third spacer material layer 212, which is a thickness booster layer. In the third gate spacers 232 and the fourth gate spacers 242, the first spacer material layer 210 takes up a first thickness T1, the second spacer material layer 211 takes up a second thickness T2, the third spacer material layer 212 takes up a third thickness T3, and the fourth spacer material layer 214 takes up a fourth thickness T4. The first thick T1 is similar to the as-deposited thickness of the first spacer material layer 210 and is between about 2.5 nm and about 3.0 nm. The second thick T2 is similar to the as-deposited thickness of the second spacer material layer 211 and is between about 2.5 nm and about 3.0 nm. As the third spacer material layer 212 has been subject to etch back, the third thick T3 is smaller than the as-deposited thickness of the third spacer material layer 212 and is between about 7 nm and about 19 nm. As the fourth spacer material layer 214 has been subject to etching, the fourth thick T4 is smaller than the as-deposited thickness of the fourth spacer material layer 214 and is between about 4 nm and about 5.5 nm. As a result, a thickness of the third gate spacer 232 along the X direction may be between about 14 nm and about 30 nm and a thickness of the fourth gate spacer 242 along the X direction may be between about 9 nm and about 12 nm. As illustrated in FIG. 22, a first channel length L1 may be between about 74 nm and about 6 µm (6000 nm) and the second channel length L2 may be less than 74 nm. The third gate spacer 232 helps space the first channel region C1 apart from the first source/drain feature 218-1 by a first distance D1. The first distance D1 may be similar to the thickness of the third gate spacer 232 when the first source/drain feature 218-1 does not undercut the third gate spacer 232. The first distance D1 spans across the LDD zone formed at block 412. The fourth gate spacer 242 helps space the second channel region C2 apart from the second source/drain feature 218-2 by a second distance D2. The second distance D2 may be similar to the thickness of the fourth gate spacer 242 when the second source/drain feature 218-2 does not undercut the fourth gate spacer 242. The second distance D2 spans across the LDD zone formed at block 412. In some instances represented in FIG. 22, the second source/drain feature 218-2 undercuts the fourth gate spacer 242 and the second distance D2 is smaller than the thickness of the fourth gate spacer 242. Because of the longer first channel length L1 and the thicker third gate spacer 232, the third transistor 272 may have an operating voltage between about 3.3 V and about 5.0 V, making it suitable for high-voltage or I/O applications.

Referring to FIG. 12, method 400 includes a block 424 where further processes are performed. Such further processes have been described above and are omitted here for brevity.

Attention is now directed to method 500.

Figure 24:
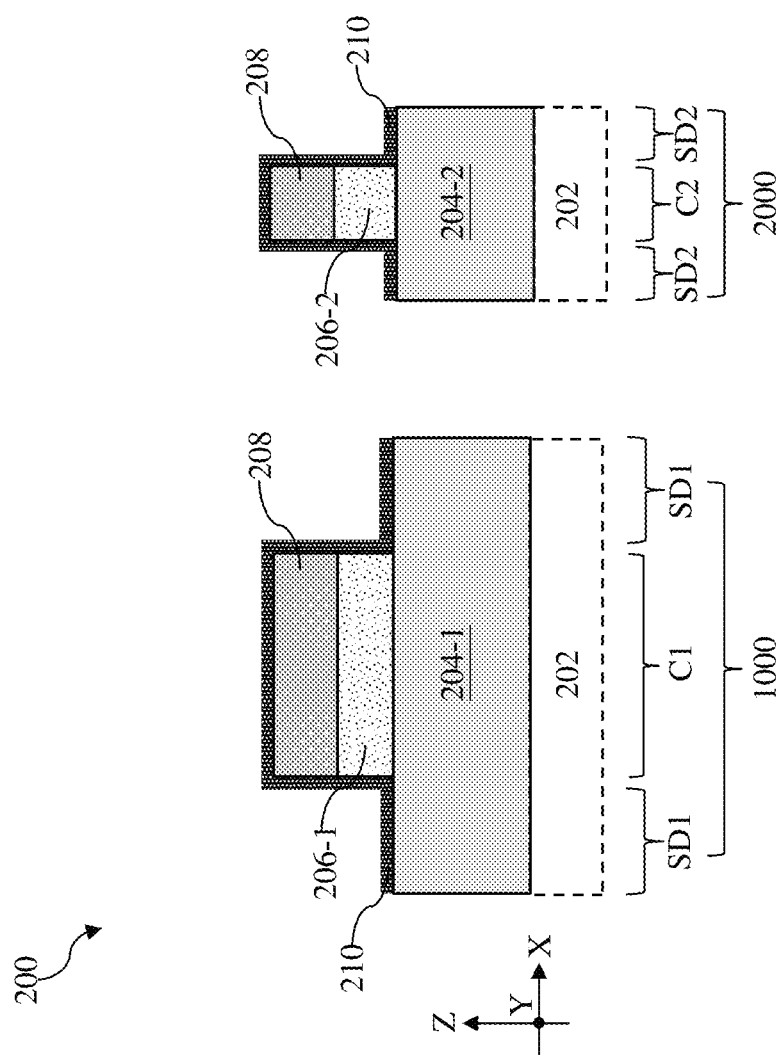
FIGS. 24-33 are fragmentary cross-sectional views of a workpiece undergoing various operations of the method in FIG. 23, according to various aspects of the present disclosure.

Referring to FIGS. 23 and 24, method 500 includes a block 502 where a workpiece 200 is received. As shown in FIG. 24, the workpiece 200 includes a substrate 202, a first fin structure 204-1 over a first area 1000 of the substrate 202, a second fin structure 204-2 over a second area 2000 of the substrate 202, a first dummy gate stack 206-1 over the first fin structure 204-1, and a second dummy gate stack 206-2 over the second fin structure 204-2. Because the workpiece 200 have been described above with respect to block 102 of method 100, detailed descriptions of the workpiece 200 is omitted for brevity. For simplicity, the substrate 202 is only schematically shown in FIG. 24 and is omitted from FIGS. 25-33 for simplicity.

Referring to FIGS. 23 and 24, method 500 includes a block 504 where a first spacer material layer 210 is deposited over the workpiece 200. In some embodiments, the first spacer material layer 210 may include silicon, oxygen, carbon and nitrogen. In one embodiment, the first spacer material layer 210 may include silicon oxycarbonitride (SiOCN). The first spacer material layer 210 may have a dielectric constant similar to that of a silicon oxide layer. In some implementations, the first spacer material layer 210 may be deposited on the gate-top hard mask 208, sidewalls of the first dummy gate stack 206-1 and the first fin structure 204-1 in the first area 1000. In the second area 2000, the first spacer material layer 210 may be deposited on surfaces of the gate-top hard mask 208, sidewalls of the second dummy gate stack 206-2 and the second fin structure 204-2. The first spacer material layer 210 may be deposited using CVD process, a subatmospheric CVD (SACVD) process, an ALD process, a PVD process, or other suitable process. In some implementations, the first spacer material layer 210 may have a thickness between about 2.5 nm and about 3.0 nm.

Figure 25:
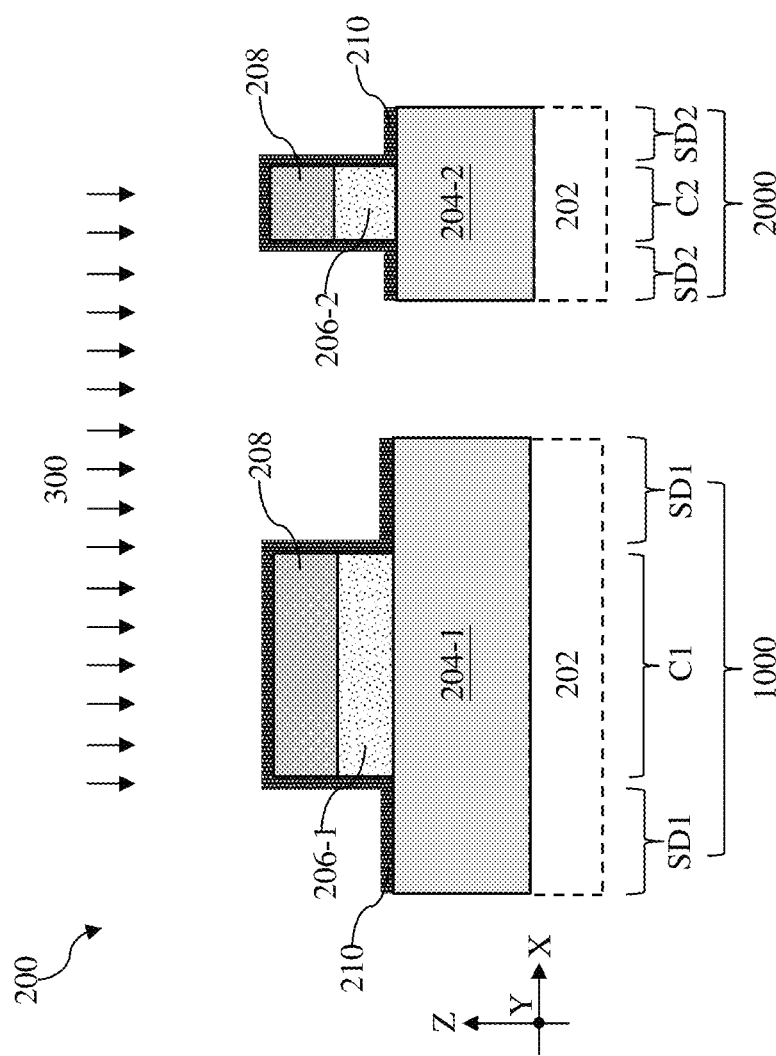

Referring to FIGS. 23 and 25, method 500 includes a block 506 where an implantation process 300 is performed. In some embodiments, the implantation process 300 is performed to form lightly doped source/drain (LDD) zones (not shown) over the first source/drain region SD1 and the second source/drain regions SD2. The implantation process 300 may utilize n-type dopants, such as phosphorus (P) or arsenic (As), for n-type field effect transistors (NFETs), or p-type dopants, such as boron (B) or indium (In), for p-type field effect transistors (PFETs). For example, operations at block 506 may implant n-type dopant(s) into the first source/drain region SD1 and the second source/drain regions SD2. The LDD regions are self-aligned with first dummy gate stack 206-1 and the second dummy gate stack 206-2. In some implementations, the first spacer material layer 210 serves as a screen layer or protective layer to control the thickness of the LDD zones and to reduce surface damages. Although not explicitly shown in the figures, after the implantation process 300, the workpiece 200 is annealed to activate the implanted ions in the LDD zones.

Figure 26:
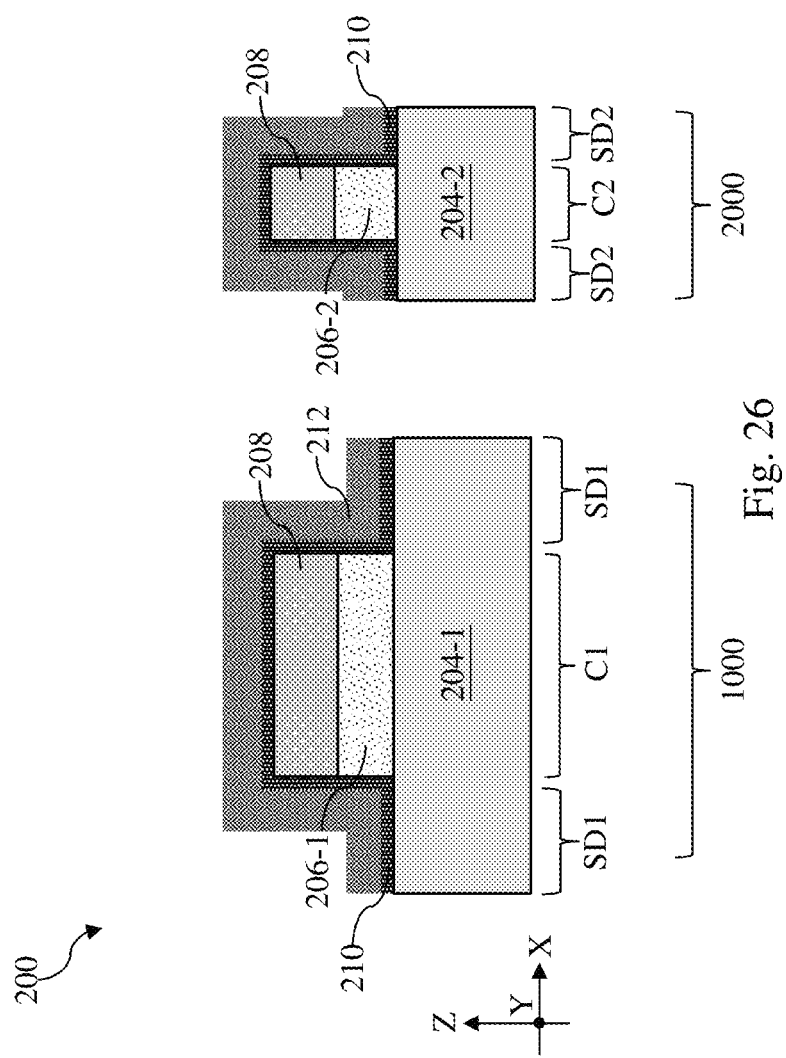

Referring to FIGS. 23 and 26, method 500 includes a block 508 where a third spacer material layer 212 is deposited over the workpiece 200. The third spacer material layer 212 is formed of a dielectric material that is different from the fin structures, the first spacer material layer 210, the second spacer material layer 211, and the fourth spacer material 214. As such, its different composition allows selective removal of the third spacer material layer 212 without damaging adjacent structures. As the composition and formation of the third spacer material layer 212 has been described above, detailed description of the third spacer material layer 212 is omitted for brevity. In method 500, the third spacer material layer 212 may serve as a thickness booster. In this regard, the third spacer material layer 212 may also be referred to as a thickness booster layer. In some instances, the thickness of the third spacer material layer 212 may be between about 8 nm and about 20 nm. By design of the present disclosure, the third spacer material layer 212 has a low dielectric constant in order to increase thickness without increasing the dielectric constant.

Figure 27:
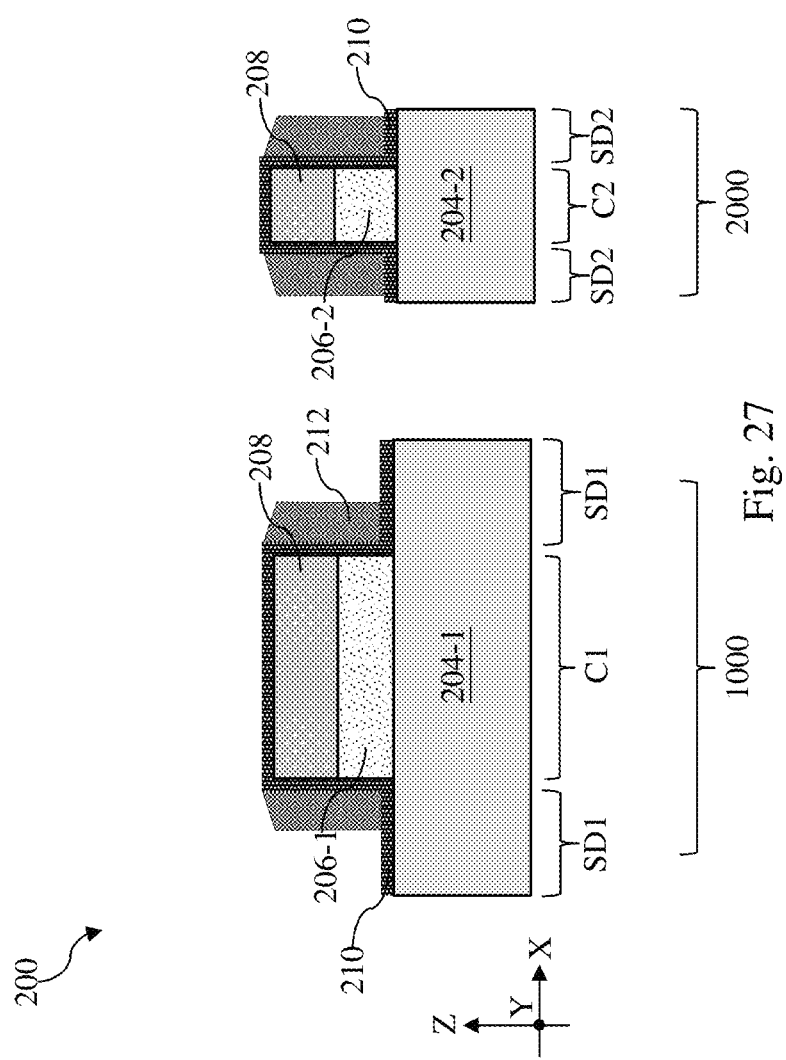

Referring to FIGS. 23 and 27, method 500 includes a block 510 where the third spacer material layer 212 is etched back. In some embodiments, at block 510, the workpiece 200 may be subjected to an anisotropic dry etch process, such as a reactive-ion etching (RIE). The anisotropic dry etch process at block 510 may remove portions of the third spacer material layer 212 that are deposited on the first spacer material layer 210. The different composition of the third spacer material layer 212 allows selective etching thereof without substantially damaging the first spacer material layer 210. As shown in FIG. 27, operations at block 510 leave behind the third spacer material layer 212 along sidewalls of the first dummy gate stack 206-1 (as well as the gate-top hard mask 208 thereon) and the second dummy gate stack 206-2 (as well as the gate-top hard mask 208 thereon). In some implementations, the anisotropic dry etch process at block 510 may implement a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, oxygen, hydrogen, other suitable gases and/or plasmas, and/or combinations thereof.

Figure 28:
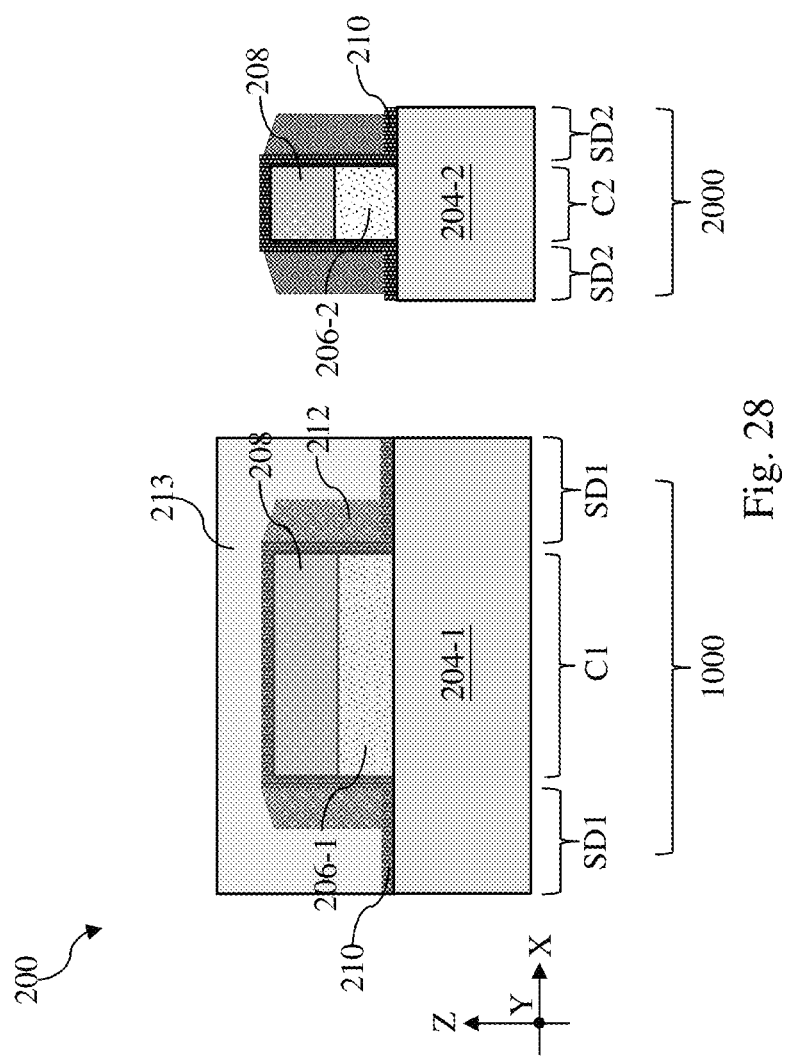

Referring to FIGS. 23 and 28, method 500 includes a block 512 where the third spacer material layer 212 in the second area 2000 is selectively removed. In some embodiments represented in FIG. 28, a photoresist mask 213 that covers the first area 1000 but exposes the second area 2000 is formed over the workpiece 200. In an example process, a photoresist layer is blanketly deposited over the workpiece 200 and patterned using a photolithography process. With the photoresist mask 213 protecting the first area 1000, the third spacer material layer 212 in the second area 2000 may be selectively removed using a selective wet etch process, a selective dry etch process, or a suitable selective etch process. An example selective wet etch process may include use of diluted hydrofluoric acid (DHF) or buffered hydrofluoric acid (BHF). Buffered hydrofluoric acid (BHF) here may include hydrofluoric acid (HF) and ammonia ($NH_3$).

Figure 29:
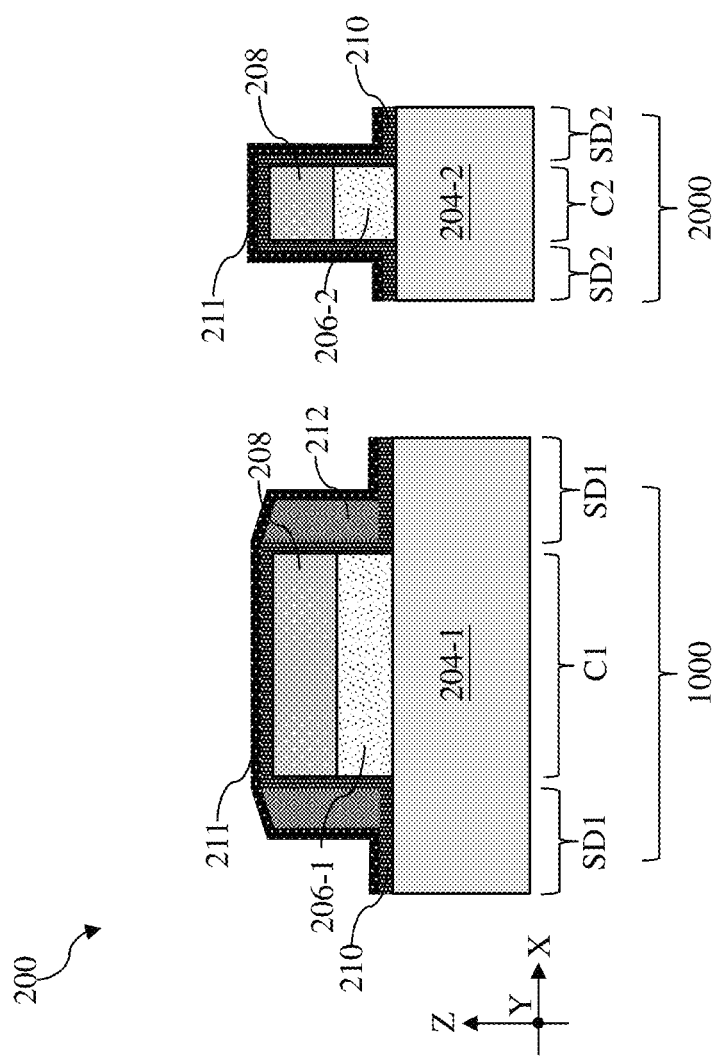

Referring to FIGS. 23 and 29, method 500 includes a block 514 where a second spacer material layer 211 is deposited over on first spacer material layer 210 and the third spacer material layer 212. In some embodiments, the second spacer material layer 211 and the first spacer material layer 210 may have the same composition. In these embodiments, the second spacer material layer 211 may include silicon, oxygen, carbon and nitrogen. In one embodiment, the second spacer material layer 211 may include silicon oxycarbonitride (SiOCN). The second spacer material layer 211 may have a dielectric constant similar to that of a silicon oxide layer. In some implementations, the second spacer material layer 211 may be deposited using CVD process, an SACVD process, an ALD process, a PVD process, or other suitable process. In some implementations, the second spacer material layer 211 may have a thickness similar to that of the first spacer material layer 210. In some instances, the thickness of the second spacer material layer 211 may be between about 2.5 nm and about 3.0 nm.

Figure 30:
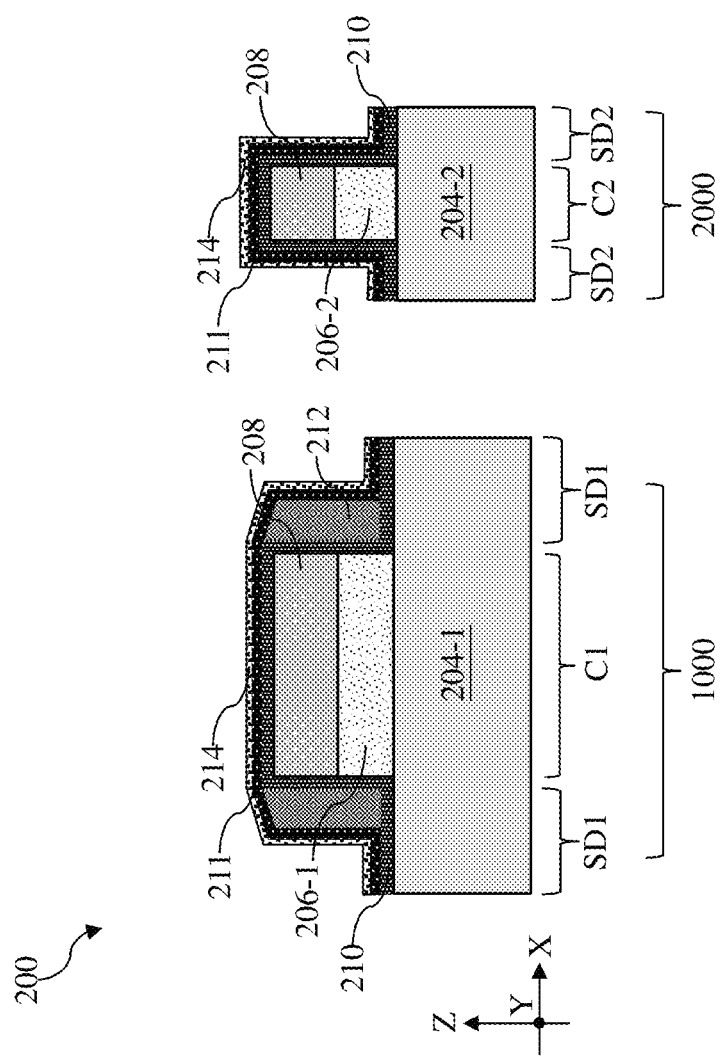

Referring to FIGS. 23 and 30, method 500 includes a block 516 wherein a fourth spacer material layer 214 is deposited on the second spacer material layer 211. In some embodiments, the fourth spacer material layer 214 is more etch-resistant than the first spacer material layer 210, the second spacer material layer 211, and the third spacer material layer 212. It is observed that etch resistant is, in general, positively correlated to dielectric constant. That is, the dielectric constant of the fourth spacer material layer 214 is greater than that of the first spacer material layer 210, the second spacer material layer 211, or the third spacer material layer 212. The fourth spacer material layer 214 may include silicon and nitrogen and may be free of oxygen. In one embodiment, the fourth spacer material layer 214 may be formed of silicon nitride (SiN). In some implementations, the fourth spacer material layer 214 may be deposited over the second spacer material layer 211 using CVD process, an SACVD process, an ALD process, a PVD process, or other suitable process. In some instances, the fourth spacer material layer 214 has a thickness between about 4.5 nm and about 6 nm.

Figure 31:
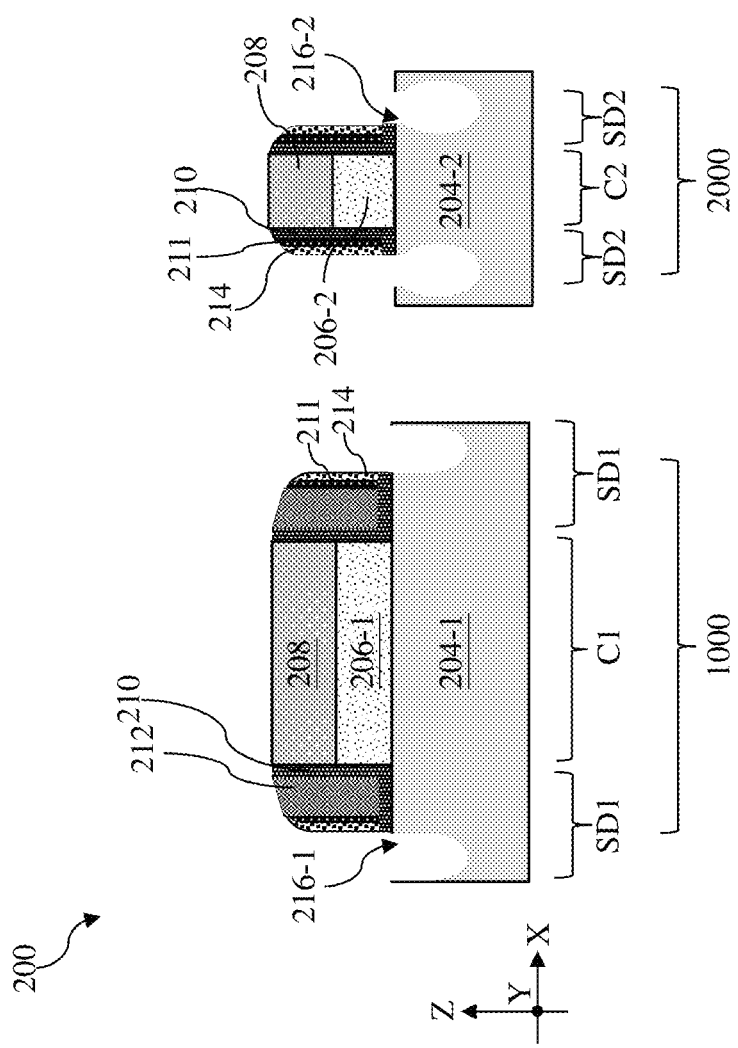

Referring to FIGS. 23 and 31, method 500 includes a block 518 where first source/drain trenches 216-1 are formed in the first area 1000 and second source/drain trenches 216-2 are formed in the second area 2000. At block 518, the first source/drain regions SD1 and the second source/drain regions SD2 that are not protected by the first dummy gate stack 206-1, the second dummy gate stack 206-2, and the spacer material layers are recessed to form the first source/drain trenches 216-1 in the first area 1000 and the second source/drain trenches 216-2 in the second area 2000. Operations at block 518 may be performed using an anisotropic dry etch process. In some implementations, the anisotropic dry etch process at block 518 may implement a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, oxygen, hydrogen, other suitable gases and/or plasmas, and/or combinations thereof. As shown in FIG. 31, the anisotropic dry etch process not only forms the first source/drain trenches 216-1 and the second source/drain trenches 216-2, but also removes the fourth spacer material layer 214, the second spacer material layer 211, and the first spacer material layer 210 from the top surfaces of the gate-top hard mask 208.

Figure 32:
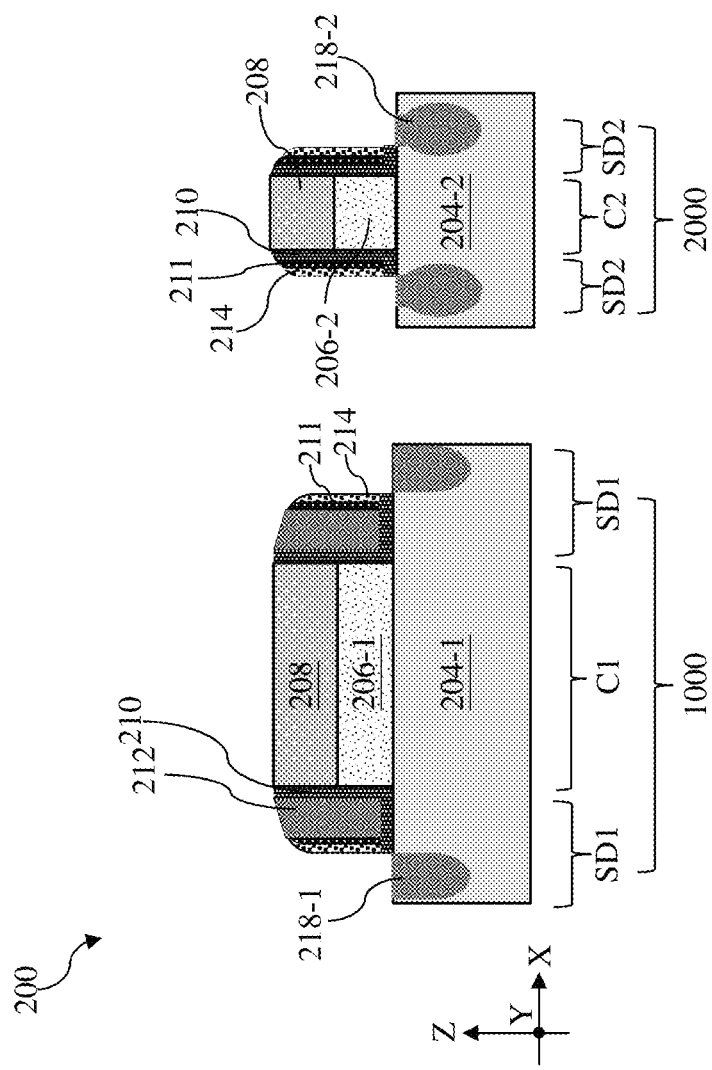

Referring to FIGS. 23 and 32, method 500 includes a block 520 where first source/drain features 218-1 are formed in the first source/drain trenches 216-1 and second source/drain features 218-2 are formed in the second source/drain trenches 216-2. As the first source/drain features 218-1 and the second source/drain features 218-2 have been described above with respect to block 120, detailed descriptions thereof are omitted here for brevity.

Figure 33:
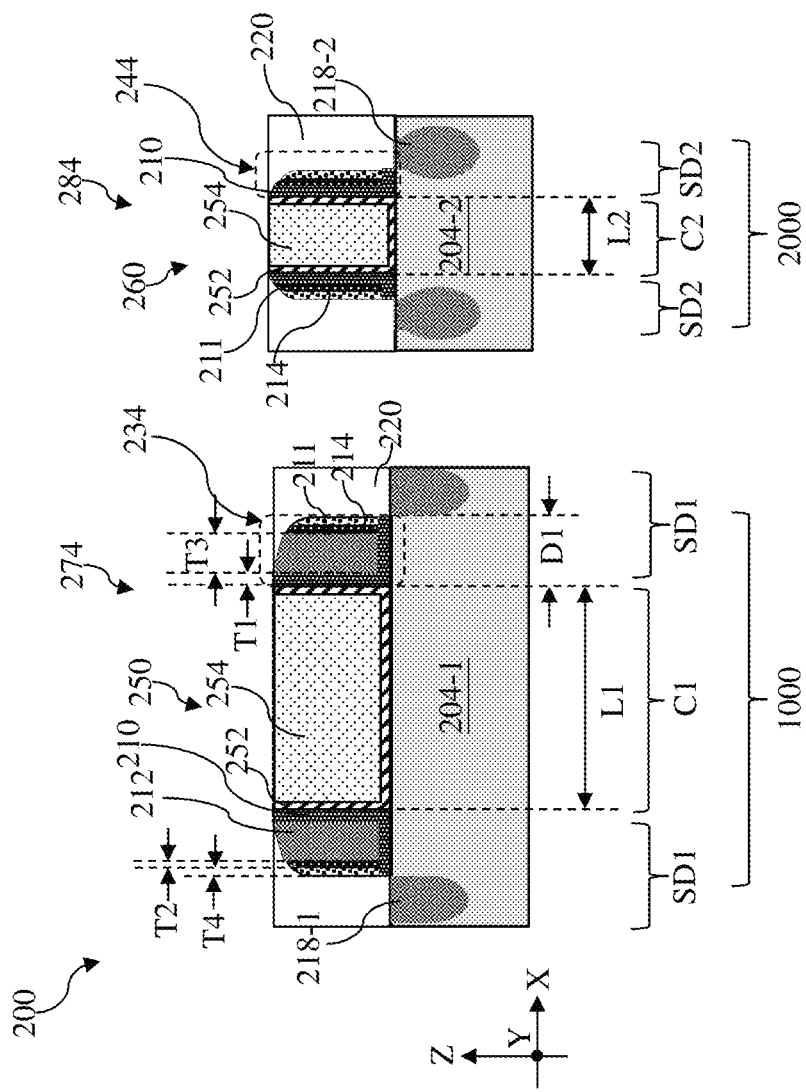

Referring to FIGS. 23 and 33, method 500 includes a block 522 where the first dummy gate stack 206-1 is replaced with a first gate structure 250 and the second dummy gate stack 206-2 is replaced with a second gate structure 260. As the first gate structure 250 and the second gate structure 260 have been described above with respect to block 122 of method 100, detailed descriptions thereof are omitted here for brevity.

Reference is still made to FIG. 33. Upon conclusion of the operations at block 522, a fifth transistor 274 and a sixth transistor 284 are substantially formed. The fifth transistor 274 may be an I/O FinFET in the first area 1000 and the sixth transistor 284 may be a core FinFET in the second area 2000. The fifth transistor 274 includes fifth gate spacers 234 disposed along sidewalls of the first gate structure 250. The sixth transistor 284 includes sixth gate spacers 244 disposed along sidewalls of the second gate structure 260 in the second area 2000. Each of the fifth gate spacers 234 includes the first spacer material layer 210, the second spacer material layer 211, the third spacer material layer 212, and the fourth spacer material layer 214. Each of the sixth gate spacers 244 includes the first spacer material layer 210, the second spacer material layer 211, and the fourth spacer material layer 214. Compared to the fifth gate spacer 234, the sixth gate spacer 244 does not include the third spacer material layer 212, which is a thickness booster layer. In the fifth gate spacers 234 and the sixth gate spacers 244, the first spacer material layer 210 takes up a first thickness T1, the second spacer material layer 211 takes up a second thickness T2, the third spacer material layer 212 takes up a third thickness T3, and the fourth spacer material layer 214 takes up a fourth thickness T4. The first thick T1 is similar to the as-deposited thickness of the first spacer material layer 210 and is between about 2.5 nm and about 3.0 nm. The second thick T2 is similar to the as-deposited thickness of the second spacer material layer 211 and is between about 2.5 nm and about 3.0 nm. As the third spacer material layer 212 has been subject to etch back, the third thick T3 is smaller than the as-deposited thickness of the third spacer material layer 212 and is between about 7 nm and about 19 nm. As the fourth spacer material layer 214 has been subject to etching, the fourth thick T4 is smaller than the as-deposited thickness of the fourth spacer material layer 214 and is between about 4 nm and about 5.5 nm. As a result, a thickness of the fifth gate spacer 234 along the X direction may be between about 14 nm and about 30 nm and a thickness of the sixth gate spacer 244 along the X direction may be between about 9 nm and about 12 nm. As illustrated in FIG. 33, a first channel length L1 may be between about 74 nm and about 6 μm (6000 nm) and the second channel length L2 may be less than 74 nm. The fifth gate spacer 234 helps space the first channel region C1 apart from the first source/drain feature 218-1 by a first distance D1. The first distance D1 may be similar to the thickness of the fifth gate spacer 234 when the first source/drain feature 218-1 does not undercut the fifth gate spacer 234. The first distance D1 spans across the LDD zone formed at block 506. The sixth gate spacer 244 helps space the second channel region C2 apart from the second source/drain feature 218-2 by a second distance D2. The second distance D2 may be similar to the thickness of the sixth gate spacer 244 when the second source/drain feature 218-2 does not undercut the sixth gate spacer 244. The second distance D2 spans across the LDD zone formed at block 506. In some instances represented in FIG. 33, the second source/drain feature 218-2 undercuts the sixth gate spacer 244 and the second distance D2 is smaller than the thickness of the sixth gate spacer 244. Because of the longer first channel length L1 and the thicker fifth gate spacer 234, the fifth transistor 274 may have an operating voltage between about 3.3 V and about 5.0 V, making it suitable for high-voltage or I/O applications.

Referring to FIG. 23, method 500 includes a block 524 where further processes are performed. Such further processes have been described above and are omitted here for brevity.

The first gate spacer 230, the third gate spacer 232 and the fifth gate spacer 234 share a similar thickness along the X direction. Albeit the similar thickness, the first gate spacer 230, the third gate spacer 232 and the fifth gate spacer 234 have different structures. As shown in FIG. 11, the first gate spacer 230 includes the first spacer material layer 210 adjacent to the first gate structure 250, the second spacer material layer 211 disposed on the first spacer material layer 210, the third spacer material layer 212 disposed on and along the second spacer material layer 211, and the fourth spacer material layer 214 on the sidewall of the third spacer material layer 212 and on the top surface of the second spacer material layer 211. In the first gate spacer 230, the third spacer material layer 212 is disposed between the second spacer material layer 211 and the fourth spacer material layer 214, and the second spacer material layer 211 is sandwiched between the first spacer material layer 210 and the third spacer material layer 212. As shown in FIG. 22, the third gate spacer 232 includes the third spacer material layer 212 disposed along a sidewall of the first gate structure 250, the first spacer material layer 210 disposed along a sidewall of the third spacer material layer 212, the second spacer material layer 211 disposed on the first spacer material layer 210, and the fourth spacer material layer 214 on the sidewall and the top surface of the second spacer material layer 211. In the third gate spacer 232, the first spacer material layer 210 is disposed between the third spacer material layer 212 and the second spacer material layer 211, and the second spacer material layer 211 is sandwiched between the first spacer material layer 210 and the fourth spacer material layer 214. As shown in FIG. 33, the fifth gate spacer 234 includes the first spacer material layer 210 disposed along a sidewall of the first gate structure 250 and the top surface of the first fin structure 204-1, the third spacer material layer 212 disposed on the first spacer material layer 210, the second spacer material layer 211 disposed on the sidewall of the third spacer material layer 212, and the fourth spacer material layer 214 on the sidewall of the second spacer material layer 211. In the fifth gate spacer 234, the third spacer material layer 212 is disposed between the first spacer material layer 210 and the second spacer material layer 211, and the second spacer material layer 211 is sandwiched between the third spacer material layer 212 and the fourth spacer material layer 214.

The second gate spacer 240, the fourth gate spacer 242 and the sixth gate spacer 244 share a similar thickness along the X direction. The second gate spacer 240, the fourth gate spacer 242 and the sixth gate spacer 244 also share similar structures. As shown in FIGS. 11, 22, and 33, each of the second gate spacer 240, the fourth gate spacer 242 and the sixth gate spacer 244 includes the first spacer material layer 210 adjacent the second gate structure 260, the second spacer material layer 211 disposed on the sidewall and top-facing surface of the first spacer material layer 210, and the fourth spacer material layer 214 disposed on the sidewall and top-facing surface of the second spacer material layer 211. As described above, the second gate spacer 240, the fourth gate spacer 242 and the sixth gate spacer 244 are free of the third spacer material layer 212. Without the thickness booster layer, the second gate spacer 240, the fourth gate spacer 242 and the sixth gate spacer 244 are thinner than the first gate spacer 230, the third gate spacer 232 and the fifth gate spacer 234, respectively.

Although not intended to be limiting, one or more embodiments of the present disclosure provide benefits. For example, the present disclosure provides different gate spacers in an I/O device area and a core device area of a semiconductor device. These different gate spacers include multilayer structures. The gate spacers in the I/O device area include a thickness booster layer while the gate spacers in the core device area is free of the thickness booster layer. As a result, the gate spacers in the I/O device area are thicker than the gate spacers in the core device area. The thicker gate spacers in the I/O device space the gate structure further apart from the source/drain features to reduce occurrence of HCI related failures. The material of the thickness booster layer is selected such that it can be selectively etched or removed relative to other spacer material layers. The present disclosure also discloses methods for forming different gate spacers in the I/O device area and the core device area of the semiconductor device.

According to some embodiments, the present disclosure provides a semiconductor device. The semiconductor device includes a first transistor in a first area and a second transistor in a second area. The first transistor includes a first gate structure extending lengthwise along a first direction, and a first gate spacer layer, a second gate spacer layer, and a third gate spacer layer over sidewalls of the first gate structure. The second transistor includes a second gate structure extending lengthwise along the first direction, and the first gate spacer layer and the third gate spacer layer over sidewalls of the second gate structure. The first gate spacer layer, the second gate spacer layer and the third gate spacer layer are of different compositions. The third gate spacer layer is directly on the first gate spacer layer in the second area.

In some embodiments, in the first area, the second gate spacer layer is disposed over the first gate spacer layer and the third gate spacer layer is disposed over the second gate spacer layer. In some embodiments, a width of the first gate structure along a second direction perpendicular to the first direction is greater than a width of the second gate structure along the second direction. In some implementations, the second gate spacer layer includes silicon oxide. In some embodiments, the first gate spacer layer includes silicon oxycarbonitride. In some instances, the third gate spacer layer includes silicon nitride. In some instances, the first gate spacer layer has a first thickness, the second gate spacer layer has a second thickness, and the third gate spacer layer has a third thickness. The second thickness is greater than the first thickness and the third thickness. In some implementations, the third thickness is greater than the first thickness.

According to other embodiments, the present disclosure provides an IC device including a semiconductor device. The semiconductor device includes a first transistor in a first area and a second transistor in a second area. The first transistor includes a first gate structure extending lengthwise along a first direction, and a first gate spacer layer, a second gate spacer layer, a third gate spacer layer, and a fourth gate spacer layer over sidewalls of the first gate structure. The second transistor includes a second gate structure extending lengthwise along the first direction, and the first gate spacer layer, the third gate spacer layer and the fourth gate spacer layer over sidewalls of the second gate structure. The fourth gate spacer layer, the third gate spacer layer, and the second gate spacer layer are of different compositions. The third gate spacer layer is directly on the first gate spacer layer in the second area.

In some embodiments, in the first area, the second gate spacer layer is disposed over the first gate spacer layer, the third gate spacer layer is disposed over the second gate spacer layer, and the fourth gate spacer layer is disposed over the third gate spacer layer. The first area is an input/output area and the second area is a core device area. In some embodiments, a width of the first gate structure along a second direction perpendicular to the first direction is greater than a width of the second gate structure along the second direction. In some implementations, the second gate spacer layer includes silicon oxide. In some instances, the first gate spacer layer and the third gate spacer layer include silicon oxycarbonitride. In some instances, the fourth gate spacer layer includes silicon nitride. In some implementations, the first gate spacer layer has a first thickness, the second gate spacer layer has a second thickness, the third gate spacer layer has a third thickness, and the fourth gate spacer layer has a fourth thickness. The second thickness is greater than the first thickness, the third thickness, and the fourth thickness.

According to other embodiments, the present disclosure provides a method. The method includes depositing a first dummy gate stack over a first area of a substrate and a second dummy gate stack over a second area of a substrate, depositing a first spacer material layer over the first dummy gate stack and the second dummy gate stack, depositing a second spacer material layer over the first spacer material layer, etching back the second spacer material layer, selectively removing the second spacer material layer in the second area, after the selectively removing, depositing a third spacer material layer over the first dummy gate stack and the second dummy gate stack, and etching the first spacer material layer, the second spacer material layer, and the third spacer material layer to form a first gate spacer along sidewalls of the first dummy gate stack and a second gate spacer along sidewalls of the second dummy gate stack. The first spacer material layer, the second spacer material layer and the third spacer material layer are of different compositions.

In some embodiments, the first spacer material layer includes silicon oxycarbonitride, the second spacer material layer includes silicon oxide, and the third spacer material layer includes silicon nitride. In some implementations, the etching back of the second spacer material layer includes removing the second spacer material layer on top-facing surfaces. In some instances, the selectively removing of the second spacer material layer includes forming a photoresist mask to cover the first area and expose the second area, and etching the second area using the photoresist mask as an etch mask.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
    forming, over a substrate, a first active region in a first area of the substrate and a second active region in a second area of the substrate;
    forming a first dummy gate stack over a channel region of the first active region and a second dummy gate stack over a channel region of the second active region;
    depositing a first spacer material layer over the first dummy gate stack, a source/drain region of the first active region, the second dummy gate stack, and a source/drain region of the second active region;
    depositing a second spacer material layer over the first spacer material layer while the first spacer material layer covers the source/drain region of the first active region and the source/drain region of the second active region;
    etching back the second spacer material layer to expose the first spacer material layer over the source/drain region of the first active region and the source/drain region of the second active region;
    selectively removing the second spacer material layer in the second area;
    after the selectively removing, depositing a third spacer material layer over the first dummy gate stack and the second dummy gate stack; and
    etching the first spacer material layer, the second spacer material layer, and the third spacer material layer to form a first gate spacer along sidewalls of the first dummy gate stack and a second gate spacer along sidewalls of the second dummy gate stack,
    wherein the first spacer material layer, the second spacer material layer and the third spacer material layer are of different compositions.

2. The method of claim 1,
    wherein the first spacer material layer comprises silicon oxycarbonitride,
    wherein the second spacer material layer comprises silicon oxide, and
    wherein the third spacer material layer comprises silicon nitride.

3. The method of claim 1, wherein the etching back of the second spacer material layer comprises removing the second spacer material layer on top-facing surfaces.

4. The method of claim 1, wherein the selectively removing of the second spacer material layer comprises:
    forming a photoresist mask to cover the first area and expose the second area; and
    etching the second area using the photoresist mask as an etch mask.

5. The method of claim 1, further comprising:
    before the depositing of the first spacer material layer, performing an implantation process to form a first lightly doped source/drain region over the source/drain region of the first active region and a second lightly doped source/drain region over the source/drain region of the second active region.

6. The method of claim 5, further comprising:
    before the performing of the implantation process, depositing a fourth spacer material layer over the first area and the second area of the substrate,
    wherein the implantation process is performed while the fourth spacer material layer covers the source/drain region of the first active region and the source/drain region of the second active region.

7. The method of claim 6, wherein the fourth spacer material layer comprises silicon oxycarbonitride.

8. The method of claim 1,
    wherein the first dummy gate stack comprises a first gate length,
    wherein the second dummy gate stack comprises a second gate length smaller than the first gate length.

9. A method, comprising:
receiving a workpiece comprising:
- a substrate comprising a first area and a second area,
- a first dummy gate stack over the first area and comprising a first channel length,
- a first hard mask over the first dummy gate stack,
- a second dummy gate stack over the second area and comprising a second channel length smaller than the first channel length, and
- a second hard mask over the second dummy gate stack;

depositing a first spacer material layer over the substrate, the first hard mask and the second hard mask, the first spacer material layer being in direct contact with sidewalls of the first dummy gate stack and the second dummy gate stack;

etching back the first spacer material layer to expose the first hard mask, the second hard mask, and the substrate;

after the etching back, selectively removing the first spacer material layer in the second area;

after the selectively removing, depositing a second spacer material layer over the workpiece;

after the depositing of the second spacer material layer, performing an implantation process to form a first lightly doped source/drain region over the first area adjacent the first dummy gate stack and a second lightly doped source/drain region over the second area adjacent the second dummy gate stack;

depositing a third spacer material layer over the workpiece;

anisotropically etching the workpiece to form first source/drain trenches adjacent the first dummy gate stack and form second source/drain trenches adjacent the second dummy gate stack;

forming first source/drain features over the first source/drain trenches and second source/drain features over the second source/drain trenches; and replacing the first dummy gate stack with a first gate structure and the second dummy gate stack with a second gate structure.

10. The method of claim 9, wherein the first dummy gate stack and the second dummy gate stack comprise polysilicon.

11. The method of claim 9,
wherein the first spacer material layer comprises silicon oxide,
wherein the second spacer material layer comprises silicon oxycarbonitride,
wherein the third spacer material layer comprises silicon nitride.

12. The method of claim 9,
wherein the first spacer material layer comprises a thickness between about 2.5 nm and about 3.0 nm,
wherein the second spacer material layer comprises a thickness between about 8 nm and about 20 nm,
wherein the third spacer material layer comprises a thickness between about 4.5 nm and about 6 nm.

13. The method of claim 9, wherein a dielectric constant of the third spacer material layer is greater than that of the first spacer material layer or the second spacer material layer.

14. The method of claim 9, wherein the third spacer material layer is more etch resistant than the first spacer material layer or the second spacer material layer.

15. The method of claim 9, wherein the first spacer material layer is in direct contact with the substrate.

16. A method, comprising:
receiving a workpiece comprising:
- a substrate comprising a first area and a second area,
- a first active region over the first area and comprising a channel region and a source/drain region adjacent the channel region,
- a second active region over the second area and comprising a channel region and a source/drain region adjacent the channel region,
- a first dummy gate stack over the channel region of the first active region,
- a first hard mask over the first dummy gate stack,
- a second dummy gate stack over the channel region of the second active region, and
- a second hard mask over the second dummy gate stack;

depositing a first spacer material layer over the substrate, the first hard mask and the second hard mask;

after the depositing of the first spacer material layer, performing an implantation process to form a first lightly doped source/drain region over the source/drain region of the first active region and a second lightly doped source/drain region over the source/drain region of the second active region while the first spacer material layer covers the source/drain region of the first active region and the source/drain region of the second active region;

after the performing of the implantation process, depositing a second spacer material layer over the first spacer material layer while the first spacer material layer covers the source/drain region of the first active region and the source/drain region of the second active region;

etching back the second spacer material layer to expose top-facing surfaces of the first spacer material layer;

selectively removing the second spacer material layer in the second area;

after the selectively removing, depositing a third spacer material layer over the workpiece;

anisotropically etching the workpiece to form first source/drain trenches adjacent the first dummy gate stack and form second source/drain trenches adjacent the second dummy gate stack;

forming first source/drain features over the first source/drain trenches and second source/drain features over the second source/drain trenches; and replacing the first dummy gate stack with a first gate structure and the second dummy gate stack with a second gate structure.

17. The method of claim 16,
wherein the first dummy gate stack comprises a first gate length,
wherein the second dummy gate stack comprises a second gate length smaller than the first gate length.

18. The method of claim 16, wherein, after the etching back, the substrate remains covered by the first spacer material layer.

19. The method of claim 16,
Wherein the first spacer material layer comprises silicon oxycarbonitride,
Wherein the second spacer material layer comprises silicon oxide,
Wherein the third spacer material layer comprises silicon nitride.

20. The method of claim 16, further comprising:
before depositing the third spacer material layer, depositing a fourth spacer material layer over the workpiece, wherein the fourth spacer material layer comprises silicon oxycarbonitride.

* * * * *